US012757562B2

(12) United States Patent
Nakagawa et al.

(10) Patent No.: US 12,757,562 B2
(45) Date of Patent: Oct. 6, 2026

(54) PHOTOELECTRIC CONVERSION ELEMENT

(71) Applicant: CITIZEN WATCH CO., LTD., Tokyo (JP)

(72) Inventors: Akira Nakagawa, Tokyo (JP); Yoshiharu Takane, Tokyo (JP)

(73) Assignee: CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 18/722,173

(22) PCT Filed: Dec. 16, 2022

(86) PCT No.: PCT/JP2022/046454
§ 371 (c)(1),
(2) Date: Jun. 20, 2024

(87) PCT Pub. No.: WO2023/120428
PCT Pub. Date: Jun. 29, 2023

(65) Prior Publication Data

US 2025/0089434 A1 Mar. 13, 2025

(30) Foreign Application Priority Data

Dec. 20, 2021 (JP) ................................ 2021-205821
Dec. 24, 2021 (JP) ................................ 2021-211381

(51) Int. Cl.
*H10K 30/86* (2023.01)
*H10K 30/82* (2023.01)
(Continued)

(52) U.S. Cl.
CPC ............. *H10K 30/86* (2023.02); *H10K 30/82* (2023.02); *H10K 71/60* (2023.02); *H10K 85/215* (2023.02); *H10K 85/50* (2023.02); *H10K 30/50* (2023.02)

(58) Field of Classification Search
CPC ........ H10K 30/86; H10K 30/82; H10K 71/60; H10K 85/215; H10K 85/50; H10K 30/50;
(Continued)

(56) References Cited

U.S. PATENT DOCUMENTS

2017/0355615 A1* 12/2017 Carter .................... C01G 53/00
2021/0043679 A1 2/2021 Ueda et al.

FOREIGN PATENT DOCUMENTS

JP 2019114691 A * 7/2019
JP 2020-140946 A 9/2020
(Continued)

OTHER PUBLICATIONS

Dubey (The effect of stoichiometry on the structural, thermal and electronic properties of thermally decomposed nickel oxide) RSC Adv., 2018, 8, 5882 (Year: 2018).*
(Continued)

*Primary Examiner* — Angelo Trivisonno
(74) *Attorney, Agent, or Firm* — Osha Bergman Watanabe & Burton LLP

(57) ABSTRACT

Provided is an inverted photoelectric conversion element having high conversion efficiency. A photoelectric conversion element according to the present disclosure includes, in sequence, a first conductive layer having light transparency, a hole transport layer, a light-absorbing layer expressed by a composition formula $Ag_aBi_bI_c$, an electron transport layer, and a second conductive layer. In the composition formula, the composition ratio a, b, and c satisfies c=a+3b and 2≤b/a≤4, and light incident through the first conductive layer is photoelectrically converted.

4 Claims, 17 Drawing Sheets

(51) Int. Cl.
*H10K 71/60* (2023.01)
*H10K 85/20* (2023.01)
*H10K 85/50* (2023.01)
*H10K 30/50* (2023.01)

(58) Field of Classification Search
CPC ..... C23C 14/083; C23C 14/085; C23C 14/18; C23C 14/30; C23C 14/5853; C23C 14/021; Y02E 10/549
See application file for complete search history.

(56) References Cited

FOREIGN PATENT DOCUMENTS

| | | |
|---|---|---|
| KR | 20180024949 A | 3/2018 |
| KR | 20200034637 A | 3/2020 |
| WO | 2017/170869 A1 | 10/2017 |

OTHER PUBLICATIONS

Ghosh (Superior Performance of Silver Bismuth lodide Photovoltaics Fabricated via Dynamic Hot-Casting Method under Ambient Conditions) Adv. Energy Mater. 2018, 8, 1802051 (Year: 2018).*
English JP-2019114691-A (Year: 2019).*
Thiruchelvan ("Combustion Processed Nickel Oxide and Zinc Doped Nickel Oxide Thin Films as a Hole Transport Layer for Perovskite Solar Cells") Coatings 2021, 11, 627. https://doi.org/10.3390/coatings11060627 (Year: 2021).*
International Search Report issued in corresponding International Application No. PCT/JP2022/046454 mailed Mar. 7, 2023 (8 pages).
Written Opinion issued in corresponding International Application No. PCT/JP2022/046454 mailed Mar. 7, 2023 (11 pages).
International Preliminary Report on Patentability issued in corresponding International Application No. PCT/JP2022/046454 mailed Jun. 20, 2024 (13 pages).
Akihiro Kojima et al., "Organo Metal Halide Perovskites as Visible-Light Sensitizer for Photovoltaic Cells", Journal of the American Chemical Society 131(17):6050-1, May 2009 (1 page).
Ivan Turkevych et al., "Photovoltaic Rudorffites: Lead-Free Silver Bismuth Halides Alternative to Hybrid Lead Halide Perovskites", ChemSusChem, 2017, vol. 10, pp. 3754-3759 (6 pages).
Ajay Kumar Baranwal et al., "Lead-free perovskite solar cells using Sb and Bi-based A3B2X9 and A3BX6 crystals with normal and inverse cell structures", Nano Convergence, Septmber 22, 2017, vol. 4, Article No. 26, pp. 1-14 (14 pages).
Yejin Seo et al., "Dynamic casting in combination with ramped annealing process for implementation of inverted planar Ag3BiI6 rudorffite solar cells", Journal of Power Sources, Feb. 18, 2020, vol. 453, Argicle No. 227903, pp. 1-9 (9 pages).
Park, Helen Hejin; "Inorganic Materials by Atomic Layer Deposition for Perovskite Solar Cells"; Nanomaterials, vol. 11, No. 1; Jan. 3, 2021 (21 pages).
Thiruchelvan, Ponmudi Selvan, et al.; "Combustion Processed Nickel Oxide and Zinc Doped Nickel Oxide Thin Films as a Hole Transport Layer for Perovskite Solar Cells"; Coatings, vol. 11., No. 6; May 24, 2021 (14 pages).
Wan, Xingxing, et al.; "Zinc as a New Dopant for NiOx-Based Planar Perovskite Solar Cells with Stable Efficiency near 20%"; ACS Applied Energy Materials, vol. 1, No. 8; Jul. 9, 2018 (8 pages).
Extended European Search Report issued in corresponding European Patent Application No. 22911131.5, dated Nov. 27, 2025 (12 pages).

* cited by examiner

PHOTOELECTRIC CONVERSION ELEMENT

FIELD

The present disclosure relates to a photoelectric conversion element and a laminated film.

BACKGROUND

A solar cell in which a lead halide-based perovskite crystal is used as a light-absorbing layer is known (see, e.g., "Organometal Halide Perovskites as Visible-Light Sensitizers for Photovoltaic Cells" Akihiro Kojima et al., Journal of the American Chemical Society 131 (17): 6050-1, May 2009 [hereafter "Non-Patent Literature 1" ]). A solar cell described in Non-Patent Literature 1 is one in which dye of a dye-sensitized solar cell, which uses dye as a sensitizer, is substituted with a compound having a perovskite crystal structure (hereafter a "perovskite compound") as a sensitizer. A solar cell including a perovskite compound is named a perovskite solar cell after Lev Perovski, who discovered a perovskite crystal structure. The conversion efficiency of the perovskite solar cell described in Non-Patent Literature 1 is 3.8%. However, research on perovskite solar cells has progressed; the conversion efficiency of a perovskite solar cell has rapidly improved; and development for commercializing perovskite solar cells is progressing.

However, since a perovskite compound contains lead, which is a toxic chemical element, it is desirable to develop a sensitizer that can substitute for a perovskite compound containing lead, and thus various studies have been made. For example, "Photovoltaic Rudorffites: Lead-Free Silver Bismuth Halides Alternative to Hybrid Lead Halide Perovskites" Dr. Ivan Turkevych et al., ChemSusChem Volume 10, 3754-3759, Oct. 9, 2017 (hereafter "Non-Patent Literature 2") describes photovoltaic halides expressed by a general formula $A_aB_bX_c$ in which A=Ag, Cu; B=Bi, Sb; X=I, Br; and c=a+3b, such as $Ag_3BiI_6$, $Ag_2BiI_5$, $AgBiI_4$, and $AgBi_2I_7$. In Non-Patent Literature 2, halides expressed by $A_aB_bX_c$ are named rudortfites after Walter Rudorff, who discovered oxide $NaVO_2$. Photovoltaic halides expressed by $Ag_aBi_bI_c$, which are Ag—Bi-halides, are referred to as rudortlites, and a solar cell including a rudortite is referred to as a rudorffite solar cell. A light-absorbing layer including a rudorffite is referred to as a rudorffite light-absorbing layer.

In addition, Non-Patent Literature 2 describes a rudorffite solar cell including FTO/c-$TiO_2$/m-$TiO_2$/$Ag_3BiI_6$/PTAA/Au laminated in this order from where light is incident. FTO is fluorine-doped tin oxide, PTAAis poly[bis(4-phenyl)(2,4,6-trimethylphenyl)amine], c is compact, and m is mesoporous. In the rudorffite solar cell described in Non-Patent Literature 2, FTO is a lower electrode; c-$TiO_2$ and m-$TiO_2$ are electron transport layers, which are n-type semiconductors; and $Ag_3BiI_6$ is a light-absorbing layer, which is an i-type semiconductor. PTAA is a hole transport layer, which is a p-type semiconductor; and Au is an upper electrode. The conversion efficiency of the rudorffite solar cell described in Non-Patent Literature 2 is 4.3%.

Like the rudorffite solar cell described in Non-Patent Literature 2, a rudorffite solar cell including lower electrode/electron transport layer/light-absorbing layer/hole transport layer/upper electrode laminated in this order from a substrate side on which light is incident is referred to as a non-inverted rudorffite solar cell. Contrary to the non-inverted rudorffite solar cell described in Non-Patent Literature 2, a rudorffite solar cell including lower electrode/hole transport layer/light-absorbing layer/electron transport layer/upper electrode laminated in this order from where light is incident is referred to as an inverted rudorffite solar cell.

Japanese Unexamined Patent Publication JP2019-114691A describes a photovoltaic device including an amorphous nickel oxide layer in which the atomic composition ratio of 0 to Ni is 1.10 or less. JP2019-114691A also discloses that a manufacturing process of a photovoltaic device includes treatment for reducing the number of $Ni^{3+}$ ions contained in an untreated nickel oxide layer. As the above treatment, JP2019-114691A describes ultraviolet (UV) ozone treatment and heat treatment at a temperature of 45° C. or higher.

SUMMARY

To be applied to, for example, a power source for use in IoT, it is desirable to produce a flexible solar cell having such flexibility as to be bent, using a rudorffite solar cell formed on a flexible substrate.

In the non-inverted rudorffite solar cell described in Non-Patent Literature 2, since $TiO_2$ heat-treated at high temperatures is disposed near the substrate, it is not easy to employ a flexible substrate formed of a synthetic resin that degenerates under high temperatures, such as polyimide resin, as the substrate. Since it is difficult to employ a flexible substrate as a substrate in a non-inverted rudorffite solar cell, it is not easy to form a flexible solar cell. Further, since $TiO_2$, which is the material of the electron transport layer adjoining the light-absorbing layer on the interface on which light is incident, functions as a photocatalyst and thus absorbs radiated ultraviolet rays to oxidize the interface of the light-absorbing layer, the light-absorbing layer may deteriorate in the non-inverted rudorffite solar cell.

In contrast, an inverted rudorffite solar cell, in which $TiO_2$ heat-treated at high temperatures is disposed apart from a substrate, can be formed without exposing the substrate to high temperatures, which allows for employing a flexible substrate as the substrate. Further, in an inverted rudorffite solar cell, since $TiO_2$, which is the material of the electron transport layer, is on the side remote from the incidence side of the light-absorbing layer, the interface of the light-absorbing layer is not oxidized by $TiO_2$ functioning as a photocatalyst. However, the conversion efficiency of an inverted rudorffite solar cell is less than that of a non-inverted rudorffite solar cell, and an inverted photoelectric conversion element having high conversion efficiency is desired.

To address such a problem, the present disclosure provides an inverted photoelectric conversion element having high conversion efficiency.

A photoelectric conversion element according to the present disclosure includes, in sequence, a first conductive layer having light transparency, a hole transport layer, a light-absorbing layer expressed by a composition formula $Ag_aBi_bI_c$, an electron transport layer, and a second conductive layer. In the composition formula, the composition ratio a, b, and c satisfies c=a+3b and 2≤b/a≤=4, and light incident through the first conductive layer is photoelectrically converted.

Preferably, in the photoelectric conversion element according to the present disclosure, the hole transport layer includes Zn-doped nickel oxide; in the hole transport layer, the percentage of Ni is from 30 at % to 40 at % inclusive, the percentage of O is from 55 at % to 60 at % inclusive, and the percentage of Zn is from 3 at % to 15 at % inclusive; and the percentage of O is 56.5 at % or greater from a surface of the hole transport layer to a depth of 20 nm in a depth direction or from the surface to a depth of ⅓ of the film thickness of the hole transport layer.

Preferably, in the photoelectric conversion element according to the present disclosure, the hole transport layer has a thickness from 5 nm to 500 nm inclusive, and the percentage of O is 57.0 at % or greater from the surface of the hole transport layer to a depth of 20 nm in a depth direction.

In the photoelectric conversion element according to the present disclosure, the electron transport layer preferably contains fullerene or phenyl-$C_{61}$-butyric acid methyl ester.

The photoelectric conversion element according to the present disclosure preferably further includes an interdiffusion inhibiting layer that is disposed between the hole transport layer and the light-absorbing layer and that inhibits interdiffusion of chemical elements contained in the hole transport layer and the light-absorbing layer.

In the photoelectric conversion element according to the present disclosure, the interdiffusion inhibiting layer is preferably a $SiO_2$ layer.

In the photoelectric conversion element according to the present disclosure, the substrate preferably has flexibility.

In the photoelectric conversion element according to the present disclosure, the composition ratio preferably satisfies $2 \leq b/a \leq 2.5$.

A laminated film according to the present disclosure includes a first conductive layer and a hole transport layer, wherein the hole transport layer includes Zn-doped nickel oxide; in the hole transport layer, the percentage of Ni is from 30 at % to 40 at % inclusive, the percentage of O is from 55 at % to 60 at % inclusive, and the percentage of Zn is from 3 at % to 15 at % inclusive; and the percentage of O is 56.5 at % or greater from a surface of the hole transport layer remote from the first conductive layer to a depth of 20 nm or from the surface to a depth of ⅓ of the film thickness of the hole transport layer.

A photoelectric conversion element according to the present disclosure includes a light-absorbing layer, an electron transport layer, and a second conductive layer, in this order on the surface of the hole transport layer of the laminated film.

A manufacturing method of a laminated film according to the present disclosure includes forming a lower conductive layer on a substrate, forming a hole transport layer including Zn-doped nickel oxide on the lower conductive layer, and UV ozone treating the hole transport layer.

Preferably, in the hole transport layer in the manufacturing method according to the present disclosure, the percentage of Ni is from 30 at % to 40 at % inclusive, the percentage of O is from 55 at % to 60 at % inclusive, and the percentage of Zn is from 3 at % to 15 at % inclusive.

The inverted photoelectric conversion element according to the present disclosure can improve in conversion efficiency.

DESCRIPTION OF EMBODIMENTS

Preferred embodiments of a photoelectric conversion element according to the present disclosure will now be described with reference to the drawings. However, note that the technical scope of the present disclosure is not limited to these embodiments and covers the invention described in the claims and equivalents thereof.

The term "photoelectric conversion element" refers to an element that converts light energy into electric energy, and examples thereof include a solar cell element, a photocell element, and a photovoltaic element that convert light energy including indoor light and sunlight into electric energy. A photoelectric conversion element according to an embodiment may be used as a solar cell module, also referred to as a solar panel, and a power source of a mobile device.

(Summary of a Photoelectric Conversion Element According to an Embodiment)

Figure 1:
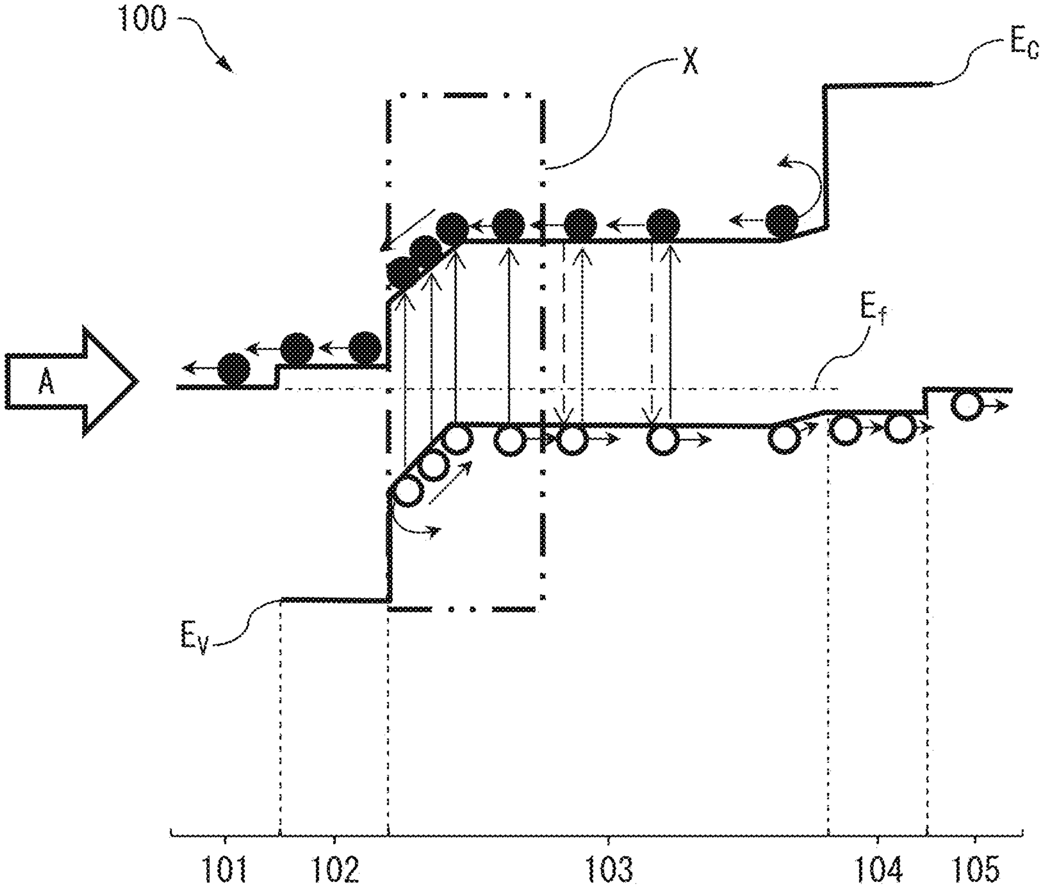
FIG. 1 schematically illustrates the energy band of a non-inverted photoelectric conversion element.
Figure 2:
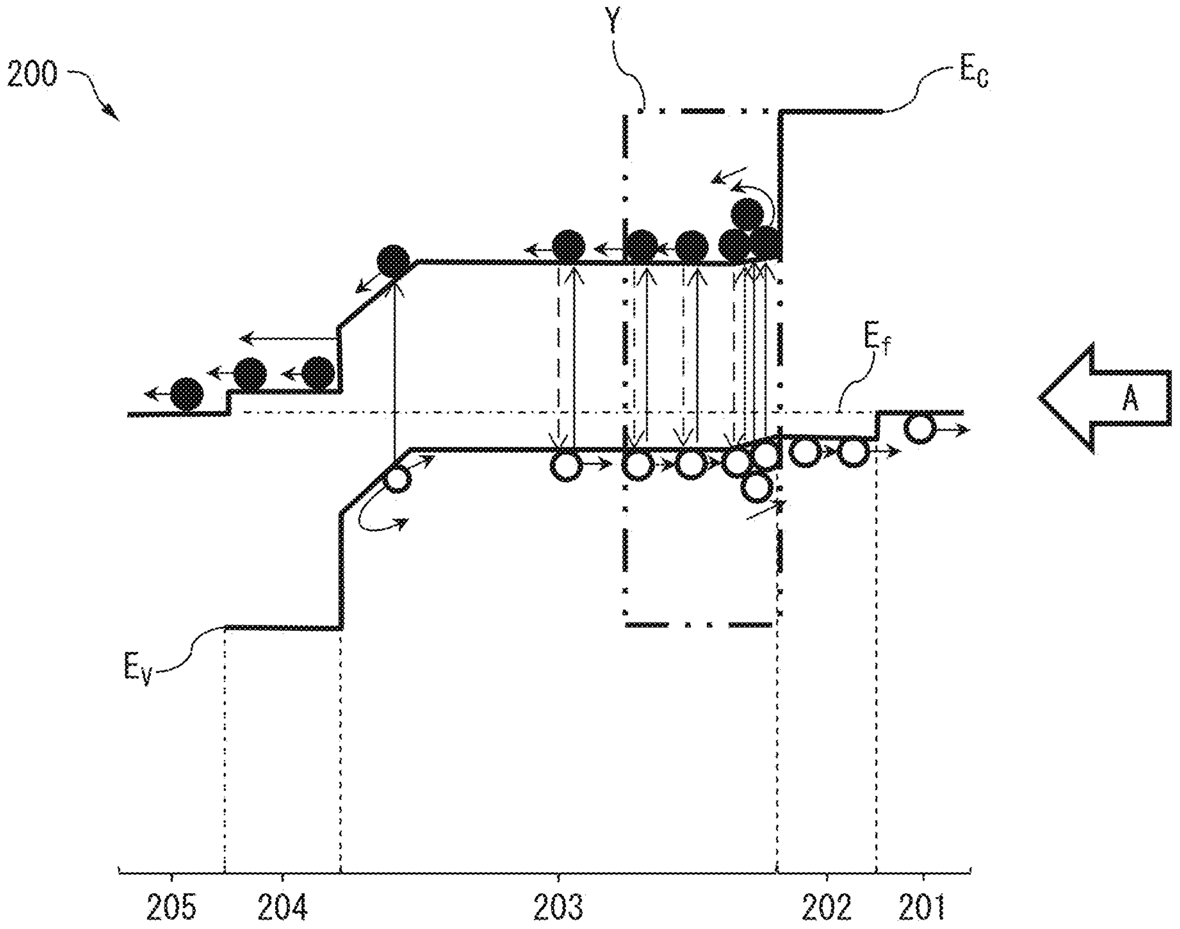
FIG. 2 schematically illustrates the energy band of an inverted photoelectric conversion element.
Figure 3:
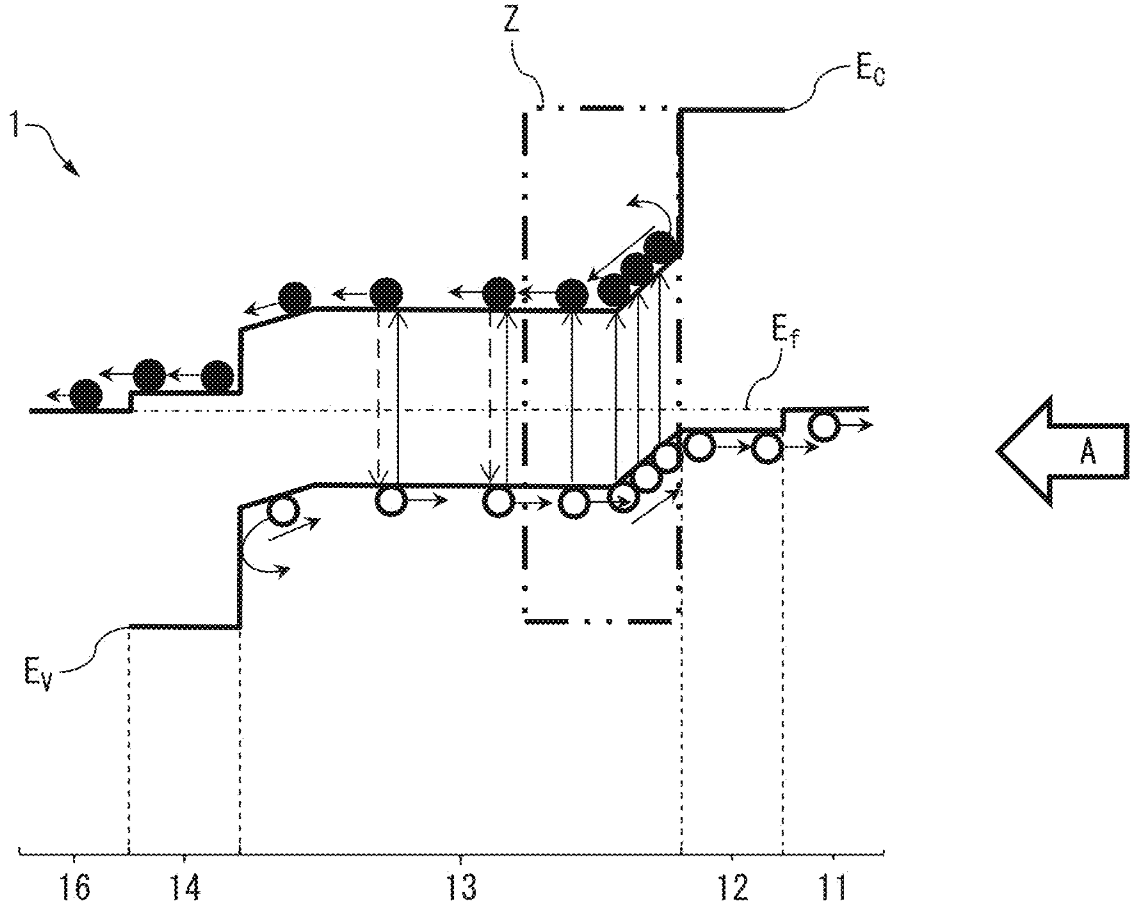
FIG. 3 schematically illustrates the energy band of an inverted photoelectric conversion element according to an embodiment.

FIG. 1 schematically illustrates the energy band of a non-inverted photoelectric conversion element 100. FIG. 2 schematically illustrates the energy band of an inverted photoelectric conversion element 200 including the same light-absorbing layer as the non-inverted photoelectric conversion element shown in FIG. 1. FIG. 3 schematically illustrates the energy band of an inverted photoelectric conversion element 1 according to an embodiment. In FIGS. 1 to 3, $E_f$ indicates a Fermi level, $E_C$ the lowest energy level of a conduction band, and $E_V$ the highest energy level of a valence band. Black circles indicate electrons, white circles indicate holes, thick arrow A the direction in which light is incident on the photoelectric conversion element, and thin arrows the direction in which electrons and holes, i.e., carriers, diffuse.

The photoelectric conversion element 100 shown in FIG. 1 includes a lower conductive layer 101, an electron transport layer 102, a light-absorbing layer 103, a hole transport layer 104, and an electrode 105, and is a non-inverted photoelectric conversion element on which light is incident through the lower conductive layer 101 and the electron transport layer 102. In the photoelectric conversion element 100, the difference between the work functions of the electron transport layer 102 and the light-absorbing layer 103 is greater than the difference between the work functions of the light-absorbing layer 103 and the hole transport layer 104.

In the photoelectric conversion element 100, since the difference between the work functions of the electron transport layer 102 and the light-absorbing layer 103 is large, a large internal electric field is generated between the electron transport layer 102 and the light-absorbing layer 103, depending on the difference between the work functions of the electron transport layer 102 and the light-absorbing layer 103. However, since the difference between the work functions of the light-absorbing layer 103 and the hole transport layer 104 is small, a small internal electric field is generated between the light-absorbing layer 103 and the hole transport layer 104.

Since light is incident on the photoelectric conversion element 100 through the lower conductive layer 101 and the electron transport layer 102, much light is absorbed in a region X in the light-absorbing layer 103 near the interface on the electron transport layer 102 to generate many carriers in the region X. In the photoelectric conversion element 100, many carriers are generated in the region X having a large internal electric field between this region and the electron transport layer 102, which causes generated electrons and holes to separate efficiently and inhibits recombination, causing the generated carriers to be efficiently transported to the lower conductive layer 101 and the electrode 105.

However, deterioration of the photoelectric conversion element 100 may be caused by photocatalysis of TiO2 contained in the electron transport layer 102.

The photoelectric conversion element 200 shown in FIG. 2 includes a lower conductive layer 201, a hole transport layer 202, a light-absorbing layer 203, an electron transport layer 204, and an electrode 205, and is an inverted photoelectric conversion element on which light is incident through the lower conductive layer 201 and the hole transport layer 202. In the photoelectric conversion element 200, the difference between the work functions of the hole transport layer 202 and the light-absorbing layer 203 is less than the difference between the work functions of the light-absorbing layer 203 and the electron transport layer 204.

In the photoelectric conversion element 200, since the difference between the work functions of the hole transport layer 202 and the light-absorbing layer 203 is small, a small internal electric field is generated between the hole transport layer 202 and the light-absorbing layer 203.

Since light is incident on the photoelectric conversion element 200 through the lower conductive layer 201 and the hole transport layer 202, much light is absorbed in a region Y in the light-absorbing layer 203 near the interface on the hole transport layer 202 to generate many carriers in the region Y Further, since the electron transport layer 204 is disposed on the opposite side of the light-absorbing layer 203 from where light is incident, the light does not reach TiO2 contained in the electron transport layer 204, and thus deterioration by photocatalysis of TiO2 contained in the electron transport layer 204 is unlikely to occur, unlike the photoelectric conversion element 100.

In the photoelectric conversion element 200, many carriers are generated in the region Y having a small internal electric field between this region and the hole transport layer 202, which makes electrons and holes unlikely to separate, causing recombination to be likely to occur. In the photoelectric conversion element 200, electrons and holes are unlikely to separate, and recombination is likely to occur, which reduces the number of carriers transported to the lower conductive layer 201 and the electrode 205, causing reduction in conversion efficiency. In the photoelectric conversion element 200, the light-absorbing layer 203 is set so that the composition ratio (b/a) in the composition formula $Ag_aBi_bI_c$ satisfies $b/a<2$, similarly to the light-absorbing layer 103.

The inventors of the present invention have found that the conversion efficiency of an inverted photoelectric conversion element including a rudorffite light-absorbing layer expressed by the composition formula $Ag_aBi_bI_c$ (hereafter simply a "light-absorbing layer") is improved by restricting the composition ratio between Ag, Bi, and I within a predetermined range.

The photoelectric conversion element 1 according to an embodiment includes a lower conductive layer 11, a hole transport layer 12, a light-absorbing layer 13, an electron transport layer 14, and an upper electrode 16, and is an inverted photoelectric conversion element on which light is incident through the lower conductive layer 11 and the hole transport layer 12. In the photoelectric conversion element 1, the difference between the work functions of the hole transport layer 12 and the light-absorbing layer 13 is greater than the difference between the work functions of the light-absorbing layer 13 and the electron transport layer 14.

In the photoelectric conversion element 1, the light-absorbing layer 13 is set so that the composition ratio (b/a) in the composition formula $Ag_aBi_bI_c$ satisfies $2\leq b/a\leq 4$. Since the difference between the work functions of the hole transport layer 12 and the light-absorbing layer 13 is large, a large internal electric field is generated between the hole transport layer 12 and the light-absorbing layer 13, depending on the difference between the work functions of the hole transport layer 12 and the light-absorbing layer 13.

Since light is incident on the photoelectric conversion element 1 through the lower conductive layer 1I and the hole transport layer 12, much light is absorbed in a region Z in the light-absorbing layer 13 near the interface on the hole transport layer 12 to generate many carriers in the region Z. In the photoelectric conversion element 1, many carriers are generated in the region Z having a large internal electric field between this region and the hole transport layer 12, which causes generated electrons and holes to separate efficiently and thus inhibits recombination, causing the generated carriers to be efficiently transported to the lower conductive layer 11 and the upper electrode 16.

The photoelectric conversion element 1 according to an embodiment, in which the composition ratio (b/a) of the light-absorbing layer satisfies $2 \leq b/a \leq 4$, has a band structure different from those of the photoelectric conversion elements 100 and 200, and thus an inverted photoelectric conversion element having high conversion efficiency is provided.

First Embodiment

Figure 4:
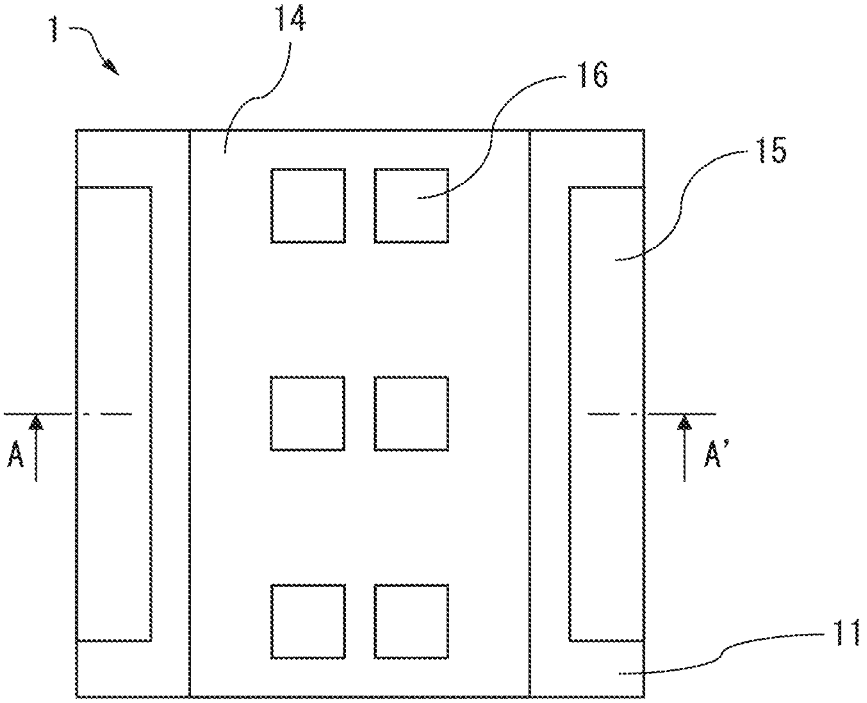
FIG. 4 is a plan view of a photoelectric conversion element according to a first embodiment.
Figure 5:
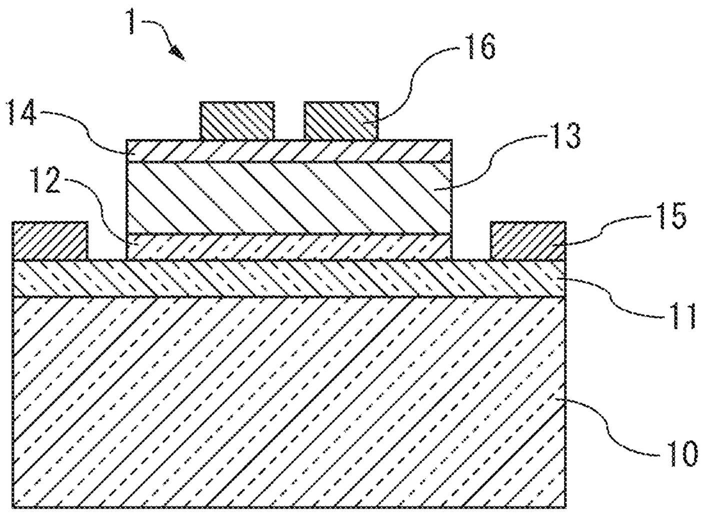
FIG. 5 is a cross-sectional view taken along A-A' shown in FIG. 4.

FIG. 4 is a plan view of the photoelectric conversion element 1 shown in FIG. 3. FIG. 5 is a cross-sectional view taken along A-A' shown in FIG. 4.

The photoelectric conversion element 1 further includes a substrate 10 and lower electrodes 15; on the substrate 10 are laminated the lower conductive layer 11, the hole transport layer 12, the light-absorbing layer 13, and the electron transport layer 14 in sequence. The photoelectric conversion element 1 is an inverted photoelectric conversion element that generates a voltage between the lower electrodes 15 and the upper electrodes 16 and that outputs a current from the lower electrodes 15, in response to light incident through the substrate 10 and the lower conductive layer 11.

The substrate 10 is formed of a transparent material that can support the components included in the photoelectric conversion element 1 and that transmits light incident on the photoelectric conversion element 1, such as an insulating glass substrate, and has a surface on which light to be absorbed by the light-absorbing layer 13 is incident. The transparent material is a material that transmits light of a wavelength to be absorbed by the light-absorbing layer 13, preferably a material that transmits at least 80% of light in the wavelength range to be absorbed by the light-absorbing layer 13, and more preferably a material that transmits at least 95% of light in the wavelength range to be absorbed by the light-absorbing layer 13. The substrate 10 may be formed of an electrically conductive material or a synthetic resin having flexibility, such as polyimide resin. The substrate 10 has a thickness, for example, from 0.1 mm to 5.0 mm inclusive. The substrate 10 may be shaped, for example, into a plate, a film-like plate, or a cylindrical plate.

The lower conductive layer 11, also referred to as a first conductive layer, is transparent similarly to the substrate 10, and is formed of a low-resistance material that can transport holes with high efficiency. The lower conductive layer 11 is formed on the substrate 10 so as to cover the substrate 10, thereby being disposed with a surface in contact with the other surface of the substrate 10. The lower conductive layer 11 is a thin film formed of, for example, fluorine-doped tin oxide (FTO) having resistivity that remains almost unchanged under high-temperature heat treatment, transparency, and high electrical conductivity. When the substrate 10 is formed of a material that is not heat-resistant, such as polyimide resin, the lower conductive layer 11 is formed of a material whose film can be formed by low-temperature heat treatment and that has transparency and high electrical conductivity. Examples of the material that whose film can be formed by low-temperature heat treatment and that has transparency and high electrical conductivity include tin-doped indium oxide (ITO), aluminum-doped zinc oxide (AZO), gallium-doped zinc oxide (GZO), and niobium-doped titanium oxide (NTO). The lower conductive layer 11 preferably has a thickness from 0.01 μm to 10.0 μm inclusive, more preferably from 0.05 Lm to 1.0 μm inclusive.

The hole transport layer 12 is a p-type semiconductor layer that blocks electrons generated in the light-absorbing layer 13 and that transports holes generated in the light-absorbing layer 13 to the lower conductive layer 11 with high efficiency. The hole transport layer 12 is formed on the lower conductive layer 11 so as to cover the lower conductive layer 11, thereby being disposed with a surface in contact with the other surface of the lower conductive layer 11. The hole transport layer 12 is formed of, for example, nickel oxide ($NiO_x$), which is transparent and excellent in hole transport properties, or another oxide, such as cuprous oxide ($Cu_2O$) and molybdenum oxide ($MoO_3$). The hole transport layer is preferably formed of an organic material that does not dissolve readily in a solvent used for further forming the light-absorbing layer 13, such as PEDOT: PSS. The hole transport layer 12 is formed of, for example, nickel oxide ($NiO_x$), cuprous oxide ($Cu_2O$), and molybdenum oxide ($MoO_3$).

Nickel oxide ($NiO_x$) ($0 \leq x \leq 1$) is a p-type semiconductor that has stable chemical properties and in which holes of Ni function as an acceptor without being doped with an impurity, and thus can be used for a material of the hole transport layer 12. Zn-doped nickel oxide (NiO:Zn) has a lower resistivity and better hole transport properties than $NiO_x$ ($0 \leq x \leq 1$) by being doped with an impurity. The ratio of Ni to Zn, Ni:Zn, is preferably between 99 at %:1 at % and 80 at %:20 at %. The percentage of added Zn is preferably less than 20 at % because reduction in the conversion efficiency of the photoelectric conversion element 1 is confirmed when the percentage of Zn content is greater than 20 at %. The percentage of added Zn is preferably 1 at % or greater because addition of Zn does not improve hole transport properties when the percentage of added Zn is less than 1 at %. The hole transport layer 12 preferably has a film thickness from 10 nm to 300 nm inclusive. When the hole transport layer 12 has a film thickness less than 10 nm, the light-absorbing layer 13 may not be sufficiently covered by the hole transport layer 12. When the hole transport layer 12 has a film thickness greater than 300 nm, resistance between the lower conductive layer 11 and the light-absorbing layer 13 is large and the conversion efficiency of the photoelectric conversion element 1 is reduced.

The light-absorbing layer 13 is formed of a rudorffite expressed by the composition formula $Ag_aBi_bI_c$. The light-absorbing layer 13 is formed on the hole transport layer 12, thereby being disposed with a surface in contact with the other surface of the hole transport layer 12. In the composition formula $Ag_aBi_bI_c$, a, b, and c indicate the composition ratio, and satisfy c=a+3b, preferably $2 \leq b/a \leq 4$, and more preferably $2 \leq b/a \leq 2.5$. The light-absorbing layer 13 preferably has a thickness from 10 nm to 10000 nm inclusive, more preferably from 20 nm to 900 nm inclusive. The light-absorbing layer 13 absorbs light incident through the lower conductive layer 11 and the hole transport layer 12. Inside the light-absorbing layer, the absorbed light excites electrons to generate electrons and holes. Holes generated inside the light-absorbing layer 13 are transported through the hole transport layer 12 and the lower conductive layer 11 to the lower electrodes 15, and electrons generated inside the light-absorbing layer 13 are transported to the upper electrodes 16 through the electron transport layer 14. The photoelectric conversion element 1 is provided with electromotive force by the holes and electrons generated inside the light-absorbing layer 13 being transported to the lower electrodes 15 and the upper electrodes 16, respectively.

The electron transport layer 14 is an n-type semiconductor that blocks holes generated in the light-absorbing layer 13 and that transports electrons generated in the light-absorbing layer 13 to the upper electrodes 16 with high efficiency. The electron transport layer 14 is formed on the light-absorbing layer 13 so as to cover the light-absorbing layer 13, thereby being disposed with a surface in contact with the other surface of the light-absorbing layer 13. The electron transport layer 14 is preferably formed of a material excellent in electron transport properties. The electron transport layer 14 is formed of, for example, a metal oxide, such as titanium oxide (e.g., $TiO_2$), tin oxide (e.g., $SnO_2$), zinc oxide (ZnO), and aluminum oxide ($Al_2O_3$), and a C-based semiconductor, such as fullerene ($C_{60}$) or phenyl-$C_{61}$-butyric acid methyl ester (PCBM). The electron transport layer 14 preferably has a thickness from 1 nm to 200 nm inclusive, more preferably from 20 nm to 60 nm inclusive.

The lower electrodes 15 and the upper electrodes 16 are, for example, a Ti/Au layer in which a gold (Au) layer is formed on a titanium (Ti) layer. These electrodes are formed of a material such that contact on the joining surfaces between the electrodes and the lower conductive layer 11 and the electron transport layer 14 disposed below is ohmic contact. The lower electrodes 15 are formed on the lower conductive layer 11. The upper electrodes 16, also referred to as a second conductive layer, are formed on the electron transport layer 14, thereby being disposed with a surface in contact with the other surface of the electron transport layer 14. The lower electrodes 15 and the upper electrodes 16 are formed of such a material as to be in ohmic contact with the lower conductive layer 11 and the electron transport layer 14, respectively, and may be formed of a metal having a relatively small work function, such as Ag, Al, and Zn, and carbon-based electrodes, such as graphite. The lower electrodes 15 and the upper electrodes 16 each may be formed as a layer of a single metal, such as Ti, Ag, Al, or Zn. However, an additional layer of a metal that is not readily oxidized, such as Au and Pt, may be formed to prevent oxidation by oxygen in the air. The lower electrodes 15 and the upper electrodes 16 each may be formed as a film of a transparent conductive material that conducts electricity well, such as ITO. The lower electrodes 15 and the upper electrodes 16 preferably have a thickness from 2 nm to 200 nm inclusive. When the lower electrodes 15 and the upper electrodes 16 have a thickness less than 2 nm, resistance in the lengthwise direction of the lower electrodes 15 and the upper electrodes 16 is large, which reduces efficiency of collection of electrons and holes, causing reduction in the conversion efficiency of the photoelectric conversion element 1. When the lower electrodes 15 and the upper electrodes 16 have a thickness greater than 200 nm, resistance in the thickness direction of the lower electrodes 15 and the upper electrodes 16 is large, which reduces the conversion efficiency of the photoelectric conversion element 1 and increases the amount of material for forming the lower electrodes 15 and the upper electrodes 16, resulting in high manufacturing cost.

(Manufacturing Method of the First Embodiment)

Figure 6:
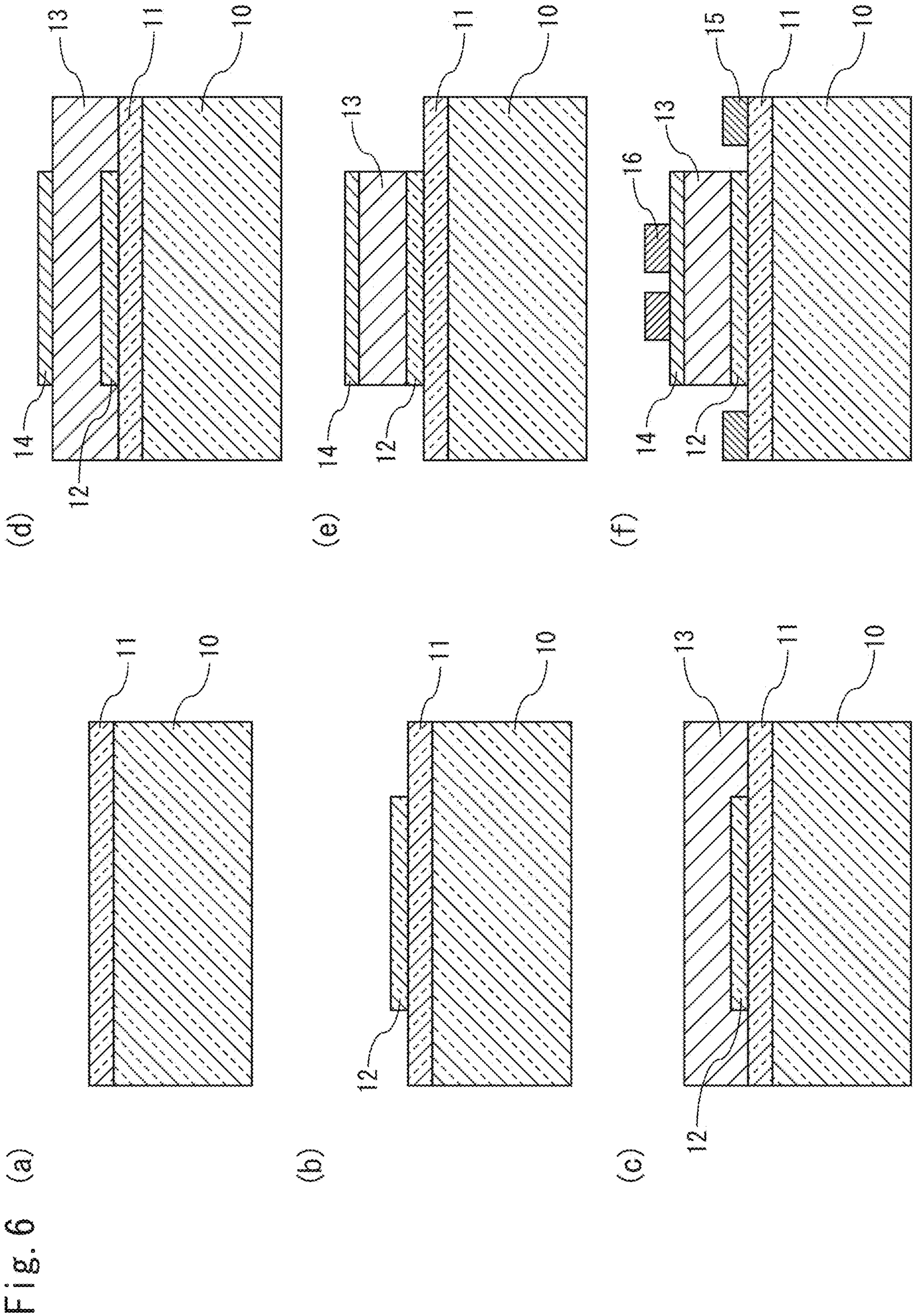
FIG. 6 illustrates a manufacturing method of the photoelectric conversion element shown in FIG. 3: (a) lower conductive layer forming step, (b) hole transport layer forming step, (c) light-absorbing layer forming step, (d) electron transport layer forming step, (e) light-absorbing layer removing step, and (f) electrode forming step.

FIG. 6 illustrates a manufacturing method of the photoelectric conversion element 1: FIG. 6(*a*) is a lower conductive layer forming step, FIG. 6(*b*) is a hole transport layer forming step, FIG. 6(*c*) is a light-absorbing layer forming step, FIG. 6(*d*) is an electron transport layer forming step, FIG. 6(*e*) is a light-absorbing layer removing step, and FIG. 6(*f*) is an electrode forming step.

First, in a lower conductive layer forming step, an FTO layer is formed as a lower conductive layer 11 on a rectangular planar substrate 10. The lower conductive layer 11 is formed, for example, by a method such as vacuum deposition, sputtering, CVD, and plating. After the lower conductive layer forming step, the substrate 10 having the lower conductive layer 11 formed thereon is preferably cleaned in a cleaning step, such as UV ozone cleaning.

Next, in a hole transport layer forming step, a Zn-doped NiO (NiO:Zn) layer is formed as a hole transport layer 12 on the surface of the lower conductive layer 11 formed on the substrate 10. The NiO:Zn layer is formed, for example, by vacuum deposition. A sample used as an evaporation source when a hole transport layer 12 is formed by vacuum deposition may be a tablet-shaped sample burned after mixing NiO powder and ZnO powder in a mortar so that Ni:Zn is between 99:1 and 80:20 and pressing the mixture. An evaporator used when a hole transport layer 12 is formed by vacuum deposition is, for example, EX-200 available from ULVAC, Inc.

In the hole transport layer forming step, first, the lower conductive layer 11 formed on the substrate 10 in the lower conductive layer forming step is disposed on a metallic mask having a rectangular opening corresponding to the shape of the hole transport layer 12 so that the surface of the lower conductive layer 11 is partially exposed through the rectangular opening. Second, the tablet-shaped NiO:Zn sample is filled in a water-cooled hearth, and the vacuum chamber is evacuated down to $4\times10^{-5}$ Torr or less. Third, gas is discharged from the NiO:Zn sample, and the NiO:Zn sample is heated with an electron beam (EB)-gun; thereafter, the shutter is opened, and particles evaporated from the NiO:Zn sample are deposited on the surface of the lower conductive layer 11 to form the hole transport layer 12. In the hole transport layer forming step, gas pressure and substrate temperature are not controlled during vapor deposition; the film thickness of the hole transport layer 12 being formed is measured with a thickness sensor such as a quartz crystal thickness monitor; and when the film thickness of the hole transport layer 12 reaches a desired thickness, the vapor deposition process is finished.

Next, in a light-absorbing layer forming step, a light-absorbing layer 13 is formed so that the composition ratio (b/a) in the composition formula $Ag_aBi_bI_c$ satisfies $2\leq b/a\leq 4$. The light-absorbing layer 13 is formed on the hole transport layer 12, for example, by spin coating. In the light-absorbing layer forming step, first, a rudorffite precursor-containing solution including a rudorffite precursor and an organic solvent is applied by spin coating to the hole transport layer 12 formed in the hole transport layer forming step, and then dried to a certain extent. Second, the substrate 10 coated with the rudorffite precursor-containing solution is burned for a predetermined time at a temperature between 70° C. and 130° C. to form the light-absorbing layer 13. When the burning temperature is below 70° C., no light-absorbing layer 13 is formed. When the burning temperature is above 130° C., I is eliminated from the light-absorbing layer 13, causing many defects inside the light-absorbing layer 13.

The rudorffite precursor is, for example, AgI and $BiI_3$. When the rudorffite precursor is AgI and $BiI_3$, the rudorffite precursor-containing solution is a solution of AgI and $BiI_3$ dissolved in an organic solvent. The organic solvent in which the rudorffite precursor is dissolved is, for example, dimethyl sulfoxide (DMSO), dimethylformamide (DMF), γ-butyrolactone (GBL), 1-N-methyl-2-pyrrolidone (NM P), or n-butylamine. The rudorffite precursor-containing solution may be prepared by pouring an organic solvent into a container containing AgI and $BiI_3$. The rudorffite precursor-containing solution may be prepared by pouring an organic solvent into a container containing $BiI_3$ and then adding AgI. The ratio, i.e., the atomic percentage (at %), of the rudorffite included in the light-absorbing layer 13 equals that of Ag ions, Bi ions, and I ions contained in the rudorffite precursor-containing solution. When the rudorffite precursor-containing solution that contains Ag, Bi, and I at desired percentages is prepared, the amounts of AgI and $BiI_3$ to be added is appropriately set. A light-absorbing layer 13 such that the composition ratio (b/a) in the composition formula $Ag_aBi_bI_c$ satisfies 2≤b/a≤4 is formed by preparing the rudorffite precursor-containing solution so that $BiI_3$ is from 2 mol to 4 mol inclusive per 1 mol of AgI.

Next, in an electron transport layer forming step, a $TiO_2$ layer is formed as an electron transport layer 14 on the surface of the formed electron transport layer 14. The $TiO_2$ layer is formed, for example, by vacuum deposition, similarly to the hole transport layer 12. A sample used as an evaporation source when an electron transport layer 14 is formed by vacuum deposition may be a tablet-shaped sample burned after pressing $TiO_2$ powder. An evaporator used when an electron transport layer 14 is formed by vacuum deposition is, for example, EX-200 available from ULVAC, Inc., as in the hole transport layer forming step.

In the electron transport layer forming step, first, the light-absorbing layer 13 formed on the substrate 10 in the light-absorbing layer forming step is disposed on a metallic mask having a rectangular opening corresponding to the shape of the light-absorbing layer 13 so that the surface of the light-absorbing layer 13 is partially exposed through the rectangular opening. Second, the tablet-shaped $TiO_2$ sample is filled in a water-cooled hearth, and the vacuum chamber is evacuated down to $4\times10^{-5}$ Torr or less. Third, gas is discharged from the $TiO_2$ sample, and the $TiO_2$ sample is heated with an EB-gun; thereafter, the shutter is opened, and particles evaporated from the $TiO_2$ sample are deposited on the surface of the light-absorbing layer 13 to form the electron transport layer 14. In the electron transport layer forming step, gas pressure and substrate temperature are not controlled during vapor deposition; the film thickness of the electron transport layer 14 being formed is measured with a thickness sensor such as a quartz crystal thickness monitor; and when the film thickness of the electron transport layer 14 reaches a desired thickness, the vapor deposition process is finished.

Next, in a light-absorbing layer removing step, the region where the electron transport layer 14 is formed is covered with a metallic mask, and an exposed portion of the hole transport layer 12, the light-absorbing layer 13, and the electron transport layer 14 that is not masked is removed with dimethylformamide (DMF). By removing the portion other than the region where the electron transport layer 14 is formed, the lower conductive layer 11 is exposed, which enables lower electrodes 15, to which holes moved to the lower conductive layer 11 will flow, to connect to the lower conductive layer 11. In the light-absorbing layer removing step, it is not necessary to completely remove the exposed portion of the light-absorbing layer 13 that is not masked, as long as lower electrodes 15 can connect to the lower conductive layer 11.

In an electrode forming step, a Ti/Au layer is formed as lower electrodes 15 on the surface of the lower conductive layer 11 formed on the substrate 10, and it is also formed as upper electrodes 16 on the surface of the electron transport layer 14. The Ti/Au layer is formed, for example, by vacuum deposition, similarly to the hole transport layer 12 and the electron transport layer 14. A photoelectric conversion element 1 is completed by forming lower electrodes 15 and upper electrodes 16 in the electrode forming step. Samples used as an evaporation source when lower electrodes 15 and upper electrodes 16 are formed by vacuum deposition may be tablet-shaped samples of Ti and Au each having a diameter of 1 mm to 2 mm. An evaporator used when lower electrodes 15 and upper electrodes 16 are formed by vacuum deposition is, for example, EX-200 available from ULVAC, Inc., as in the hole transport layer forming step and the electron transport layer forming step.

In the electrode forming step, first, the light-absorbing layer 13 partially removed in the light-absorbing layer removing step is disposed on a metallic mask. The mask used in the electrode forming step has a pair of rectangular openings corresponding to the shape of lower electrodes 15 to be formed on the lower conductive layer 11. The mask used in the electrode forming step also has six rectangular openings corresponding to the shape of upper electrodes 16 to be formed on the electron transport layer 14.

Next, the tablet-shaped Ti sample is filled in a water-cooled hearth, and the vacuum chamber is evacuated down to $4\times10^{-5}$ Torr or less. First, gas is discharged from the Ti sample, and the Ti sample is heated with an EB-gun; thereafter, the shutter is opened, and particles evaporated from the Ti sample are deposited on the surfaces of the lower conductive layer 11 and the electron transport layer 14. Second, the water-cooled hearth containing Ti is sufficiently cooled. Next, instead of the water-cooled hearth containing Ti, a cooled hearth containing the tablet-shaped Au sample is disposed in the vacuum chamber, by switching the cooled hearths with a rotation mechanism. The water-cooled hearths disposed in the vacuum chamber are switched with a rotation mechanism without opening the vacuum chamber. Third, the vacuum chamber is evacuated down to $4\times10^{-5}$ Torr or less to discharge gas from the Au sample, and the Au sample is heated with an EB-gun. Fourth, the shutter is opened, and particles evaporated from the Au sample are deposited on the surface of the Ti film formed on the lower conductive layer 11 and the electron transport layer 14. In the electrode forming step, gas pressure and substrate temperature are not controlled during vapor deposition; the film thickness of the lower electrodes 15 and the upper electrodes 16 being formed is measured with a thickness sensor such as a quartz crystal thickness monitor; and when the film thickness of the lower electrodes 15 and the upper electrodes 16 reaches a desired thickness, the vapor deposition process is finished. After the vapor deposition process, processing to make the photoelectric conversion element 1 operable as a photoelectric conversion element may be performed, such as processing to form a protective film, cutting for changing the shape to a desired one, and connection processing to connect wires to the lower electrodes 15 and the upper electrodes 16.

Since the composition ratio (b/a) of the light-absorbing layer 13 formed of a rudorffite expressed by the composition formula $Ag_aBi_bI_c$ is in the range of 2≤b/a≤4, the photoelectric conversion element 1 has a large internal electric field in a region where many electrons and holes are generated. The photoelectric conversion element 1, which has a large internal electric field in a region where many electrons and holes are generated, can inhibit recombination of electrons and holes, and achieve high conversion efficiency.

The photoelectric conversion element 1, which is of the inverted type and in which the $TiO_2$ electron transport layer 14 heat-treated at high temperatures is disposed apart from the substrate 10, can be formed without exposing the substrate 10 to high temperatures, which allows for employing a flexible substrate as the substrate 10. The photoelectric conversion element 1 can be formed as a flexible photoelectric conversion element by employing a flexible substrate as the substrate 10.

Since a $NiO_x$ layer is formed as the hole transport layer 12, the hole transport layer 12 of the photoelectric conversion element 1 can have highly stabile chemical properties. Further, since a Zn-doped $NiO_x$ layer is formed as the hole transport layer 12, the hole transport layer 12 of the photoelectric conversion element 1 can have excellent hole transport properties.

Second Embodiment

Figure 7:
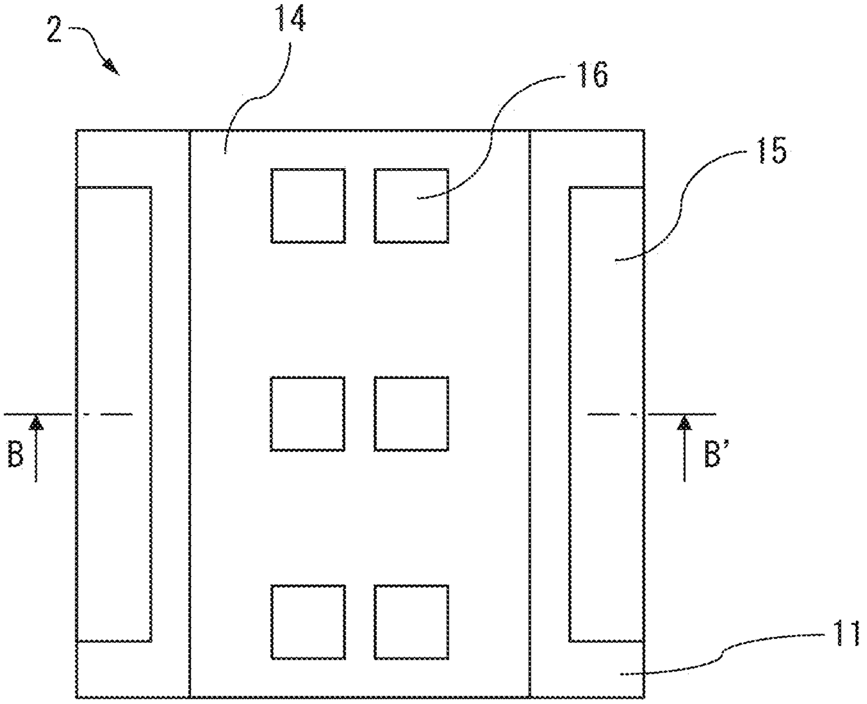
FIG. 7 is a plan view of a photoelectric conversion element according to a second embodiment.
Figure 8:
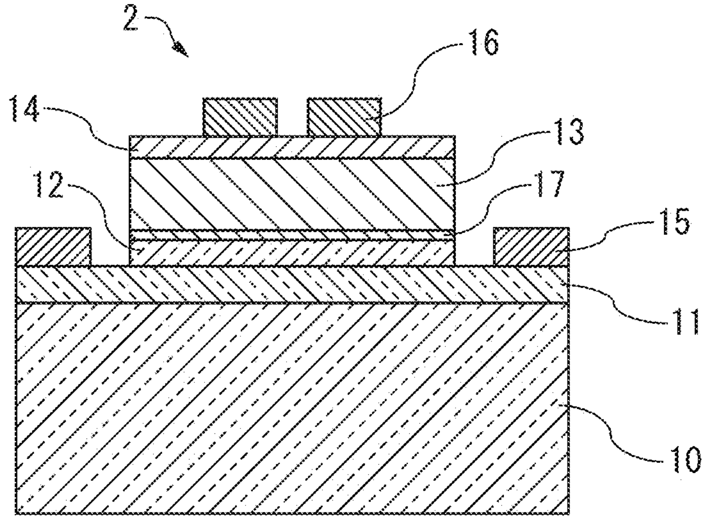
FIG. 8 is a cross-sectional view taken along line B-B' in FIG. 7.

FIG. 7 is a plan view of a photoelectric conversion element according to a second embodiment. FIG. 8 is a cross-sectional view taken along line B-B' in FIG. 7.

The photoelectric conversion element 2 differs from the photoelectric conversion element 1 in that the former includes an interdiffusion inhibiting layer 17. Since the configurations and functions of components of the photoelectric conversion element 2 except the interdiffusion inhibiting layer 17 are the same as those of the photoelectric conversion element 1 assigned the same reference numerals, detailed description thereof is omitted herein.

The interdiffusion inhibiting layer 17 is formed between the hole transport layer 12 and the light-absorbing layer 13, and that inhibits interdiffusion of chemical elements contained in the hole transport layer 12 and the light-absorbing layer 13. The material of the interdiffusion inhibiting layer 17 is preferably excellent in the property of being a barrier to diffusion of chemical elements, and is preferably a metal oxide, such as $SiO_2$ and $Al_2O_3$. $SiO_2$, whose film can be easily formed at low cost, is preferable. The interdiffusion inhibiting layer 17 preferably has a thickness from 0.1 to 2 nm inclusive. When the interdiffusion inhibiting layer 17 has a thickness less than 0.1 nm, interdiffusion of chemical elements contained in the hole transport layer 12 and the light-absorbing layer 13 is not inhibited. When the interdiffusion inhibiting layer 17 has a thickness greater than 2 and is formed of an insulating material, such as a $SiO_2$ layer, resistance between the hole transport layer 12 and the light-absorbing layer 13 is large and the conversion efficiency of the photoelectric conversion element 2 is reduced.

(Manufacturing Method of the Second Embodiment)

Figure 9:
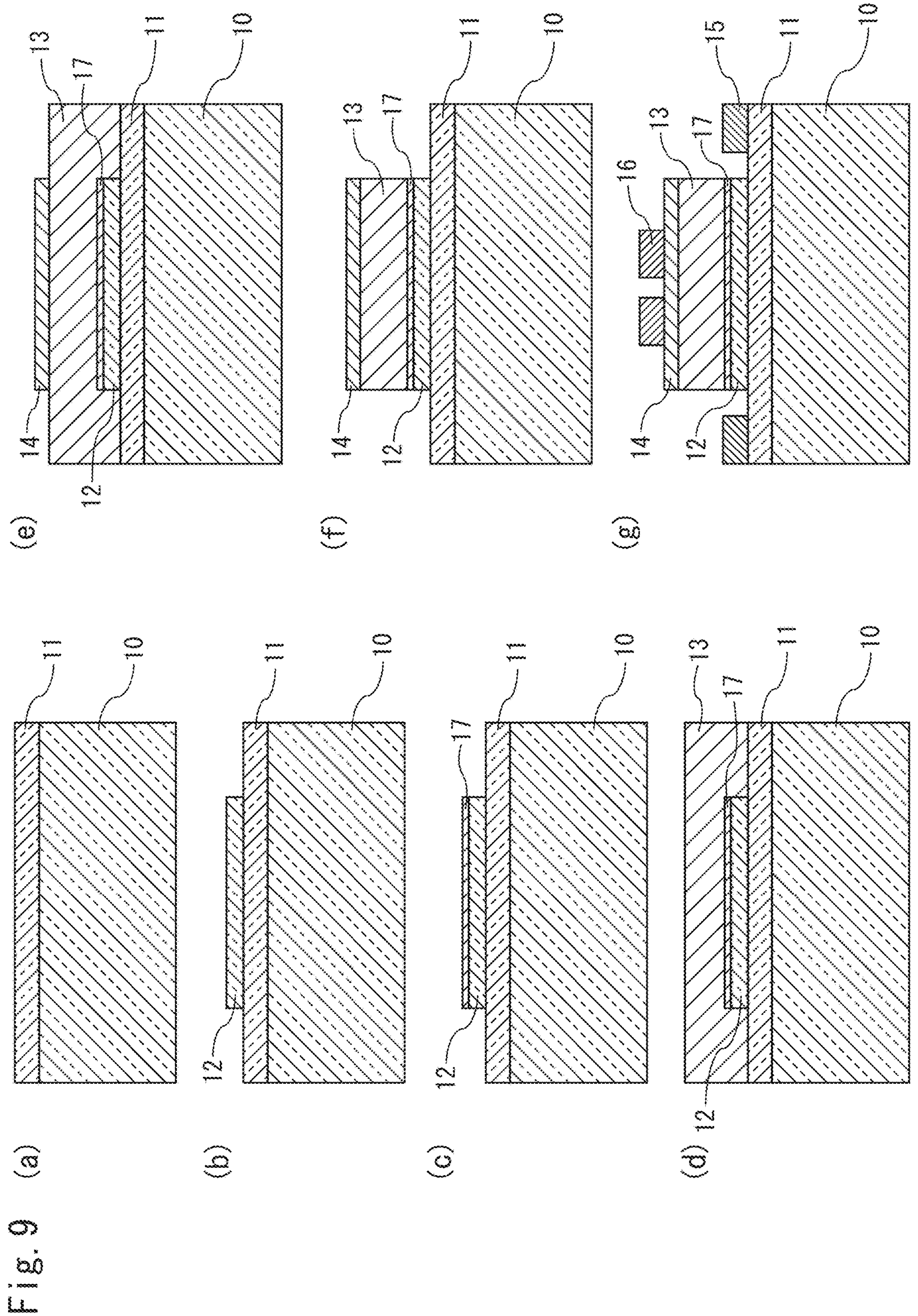
FIG. 9 illustrates a manufacturing method of the photoelectric conversion element shown in FIG. 7: (a) lower conductive layer forming step, (b) hole transport layer forming step, (c) interdiffusion inhibiting layer forming step, (d) light-absorbing layer forming step, (e) electron transport layer forming step, (f) light-absorbing layer removing step, and (g) electrode forming step.

FIG. 9 illustrates a manufacturing method of the photoelectric conversion element 2: FIG. 9(*a*) is a lower conductive layer forming step, FIG. 9(*b*) is a hole transport layer forming step, FIG. 9(*c*) is an interdiffusion inhibiting layer forming step, FIG. 9(*d*) is a light-absorbing layer forming step, FIG. 9(*e*) is an electron transport layer forming step, FIG. 9(*f*) is a light-absorbing layer removing step, and FIG. 9(*g*) is an electrode forming step. Since the steps except an interdiffusion inhibiting layer forming step are similar to those described with reference to FIG. 6, a detailed description thereof is omitted herein.

In an interdiffusion inhibiting layer forming step, a $SiO_2$ layer is successively formed as an interdiffusion inhibiting layer 17 on the surface of the hole transport layer 12 formed on the substrate 10, after the hole transport layer forming step, without opening the vacuum chamber. The interdiffusion inhibiting layer 17 is formed, for example, by vacuum deposition, similarly to the hole transport layer 12. A sample used as an evaporation source when an interdiffusion inhibiting layer 17 is formed by vacuum deposition may be particulate $SiO_2$ having a particle size approximately from 1 mm to 3 mm. An evaporator used when an interdiffusion inhibiting layer 17 is formed by vacuum deposition is, for example, EX-200 available from ULVAC, Inc., as in the hole transport layer forming step.

In the interdiffusion inhibiting layer forming step, first, a water-cooled hearth used in the hole transport layer forming step and containing a NiO:Zn tablet is sufficiently cooled. Next, instead of the water-cooled hearth containing NiO:Zn, a cooled hearth containing the $SiO_2$ sample is disposed in the vacuum chamber, by switching the cooled hearths with a rotation mechanism. Next, the vacuum chamber is evacuated down to $4\times10^{-5}$ Torr or less to discharge gas from the $SiO_2$ sample, and the $SiO_2$ sample is heated with an EB-gun. Next, the shutter is opened, and particles evaporated from the $SiO_2$ sample are deposited on the surface of a $SiO_2$ film formed on the hole transport layer 12. In the interdiffusion inhibiting layer forming step, gas pressure and substrate temperature are not controlled during vapor deposition; the film thickness of the interdiffusion inhibiting layer 17 being formed is measured with a thickness sensor such as a quartz crystal thickness monitor; and when the film thickness of the interdiffusion inhibiting layer 17 reaches a desired thickness, the vapor deposition process is finished.

In the photoelectric conversion element 2, by having the interdiffusion inhibiting layer 17, can inhibit the chemical elements contained in the hole transport layer 12 and the light-absorbing layer 13 from interdiffusing between the hole transport layer 12 and the light-absorbing layer 13, and reduce the occurrence of defects in the interface between the hole transport layer 12 and the light-absorbing layer 13. In the photoelectric conversion element 2, reduction in the occurrence of defects in the interface between the hole transport layer 12 and the light-absorbing layer 13 reduces recombination of electrons and holes through the defects in the interface, which enables electrons and holes generated by incidence of light to move to the conductive layer and the electrodes efficiently and to be extracted.

Modified Example of the First and Second Embodiments

In the photoelectric conversion elements 1 and 2, the lower conductive layer 11 is an FTO layer, and the electron transport layer 14 is a $TiO_2$ layer. However, the lower conductive layer 11 and the electron transport layer 14 in the photoelectric conversion elements according to the embodiments may be configured as layers other than an FTO layer and a $TiO_2$ layer, respectively. For example, in the photoelectric conversion elements of the embodiments, the lower conductive layer may be an ITO layer, and the electron transport layer may be a layer formed of $C_{60}$ and PCBM.

When the hole transport layer 12 has sufficient hole transport properties, the photoelectric conversion elements 1 and 2 may include a lower collector, instead of the lower conductive layer 11.

Figure 10:
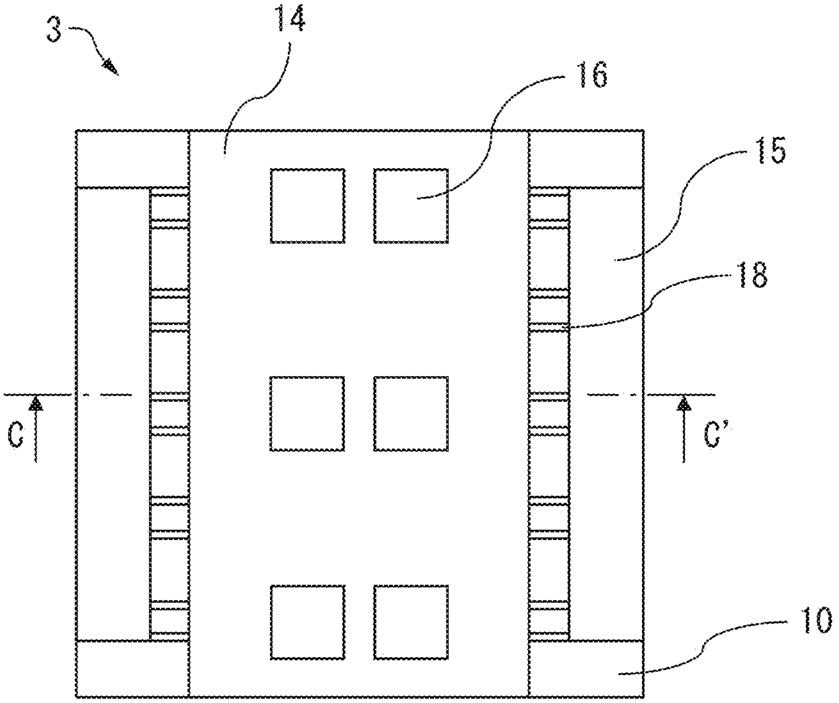
FIG. 10 is a plan view of a photoelectric conversion element according to a modified example.
Figure 11:
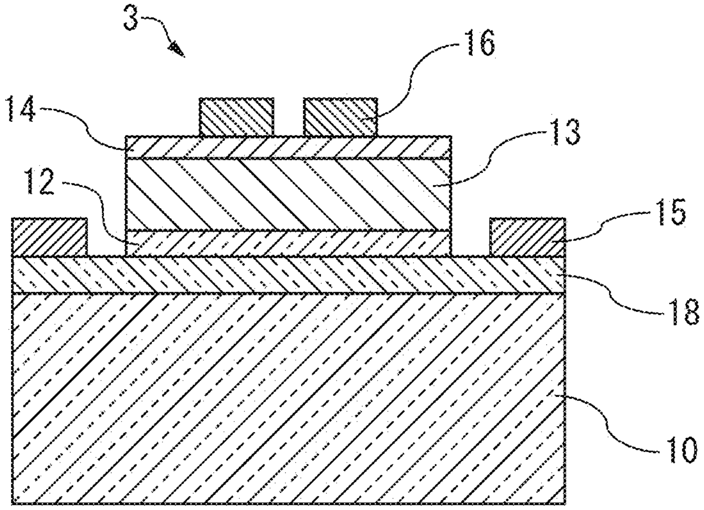
FIG. 11 is a cross-sectional view taken along C-C shown in FIG. 10.

FIG. 10 is a plan view of a photoelectric conversion element 3 according to a modified example of the first embodiment. FIG. 11 is a cross-sectional view taken along C-C' shown in FIG. 10.

The photoelectric conversion element 3 differs from the photoelectric conversion element 1 in that the former includes multiple lower collectors 18, instead of the lower conductive layer 11. Since the configurations and functions of components of the photoelectric conversion element 3 except the lower collectors 18 are the same as those of the photoelectric conversion element 1 assigned the same reference numerals, detailed description thereof is omitted herein.

Each of the lower collectors 18 has a rectangular planar shape extending in the width direction of the electron transport layer 14, and is disposed so that its edges are connected to the pair of lower electrodes 15. In the photoelectric conversion element 3 including the lower collectors 18 instead of the lower conductive layer 11, holes generated by light absorption in the light-absorbing layer 13 and moved from the light-absorbing layer 13 to the hole transport layer 12 are not extracted from the entire surface of the hole transport layer 12, but are partially extracted by the lower collectors 18.

FIG. 10 illustrates the photoelectric conversion element 3 according to a modified example of the first embodiment. However, multiple lower collectors 18 may also be similarly used in the second embodiment, instead of the lower conductive layer 11.

Examples According to the First and Second Embodiments

The following describes the property of electric power generation obtained by manufacturing photoelectric conversion elements according to examples of the first and second embodiments and comparative examples and performing current-voltage measurement of the manufactured photoelectric conversion elements.

Example 1

Example 1 is a photoelectric conversion element manufactured by the manufacturing method shown in FIG. 6 and corresponds to the first embodiment.

First, a 25-by-25-mm planar FTO glass substrate was prepared as the substrate 10 having the lower conductive layer 11 formed thereon, and the prepared FTO glass substrate was subjected to UV ozone cleaning. The glass substrate corresponding to the substrate 10 is 1 mm in thickness, and the FTO film corresponding to the lower conductive layer 11 is 1 μm in thickness.

Next, a NiO:Zn layer corresponding to the hole transport layer 12 was formed on the surface of the FTO film formed on the FTO glass substrate, by heating with an EB-gun, by vacuum deposition with EX-200 available from ULVAC, Inc. The material used for forming the hole transport layer 12 was prepared by mixing NiO powder and ZnO powder in a mortar, which powder is adjusted the Ni:Zn ratio to 90:10, and then it was made by pressing and burning it into a tablet shape. The FTO glass substrate having the lower conductive layer 11 formed thereon was placed on a metallic mask having an opening 25 mm by 15 mm, the NiO:Zn tablet was filled in a water-cooled hearth, and the vacuum chamber was evacuated down to $4\times10^{-5}$ Torr or less. Next, gas was discharged from the NiO:Zn sample, and the NiO:Zn sample was heated with an EB-gun; thereafter, the shutter was opened, and particles evaporated from the NiO:Zn sample were deposited on the surface of the lower conductive layer 11.

Next, a $AgBi_2I_7$ film corresponding to the light-absorbing layer 13 was formed on the surface of the hole transport layer 12 by spin coating. A rudorffite precursor-containing solution was made by putting AgI and $BiI_3$ in a container and adding DMSO in the container to dissolve AgI and $BiI_3$. AgI and $BiI_3$ put in the container were prepared so that Ag:Bi:I in the rudorffite precursor-containing solution would be 1:2:7. The number of revolutions of spin coating was 4000 rpm, and the time of coating with the rudorffite precursor-containing solution was 30 seconds. The FTO glass substrate coated with the rudorffite precursor-containing solution was dried to a certain extent at a temperature of 90° C. for 5 minutes, and then burned at a temperature of 120° C. for 1 hour to form a $AgBi_2I_7$ film corresponding to the light-absorbing layer 13 including a rudorffite. The film thickness of the formed $AgBi_2I_7$ film was 60 nm.

Next, a $TiO_2$ layer corresponding to the electron transport layer 14 was formed on the surface of the $Ag_1Bi_2I_7$ film, by heating with an EB-gun, by vacuum deposition with EX-200 available from ULVAC, Inc. The material used for forming the electron transport layer 14 was made into a tablet shape by pressing $TiO_2$ powder and then burning it. After the FTO glass substrate having the $Ag_1Bi_2I_7$ film formed thereon was put, the $TiO_2$ tablet was filled in a water-cooled hearth, and the vacuum chamber was evacuated down to $4\times10^{-5}$ Torr or less. Next, gas was discharged from the $TiO_2$ sample, and an EB-gun was used for heating; thereafter, the shutter was opened, and particles evaporated from the $TiO_2$ sample were deposited on the surface of the lower conductive layer 11 so that the $TiO_2$ layer would be 30 nm in thickness.

Next, the region where the electron transport layer 14 was formed was covered with a metallic mask, and an exposed portion of the hole transport layer 12, the light-absorbing layer 13, and the electron transport layer 14 that was not masked was removed with DMF.

Next, a Ti/Au layer corresponding to the lower electrodes 15 and the upper electrodes 16 was formed on the surfaces of the FTO film and the $TiO_2$ layer, by heating with an EB-gun, by vacuum deposition with EX-200 available from ULVAC, Inc., and thereby a photoelectric conversion element according to example 1 was completed. The FTO glass substrate was disposed on a metallic mask having two openings 3.25 mm by 20 mm for hole-collecting electrodes and six holes 3.2 mm by 3.2 mm for electron-collecting electrodes, and the region subjected to vapor deposition was restricted so that the Ti/Au layer would have a desired area. As an evaporation source, Ti having a diameter of 1 mm to 2 mm was filled in a water-cooled hearth; and after evacuation down to $4\times10^{-5}$ Torr or less, gas was discharged from the material, an EB-gun was used for heating, and then the shutter was opened to perform vapor deposition so that the thickness would be 2 nm. Next, after the water-cooled hearth containing Ti was sufficiently cooled, a rotation mechanism was used to switch to a water-cooled hearth filled with Au having a diameter of 1 mm to 2 mm, and then evacuation down to $4\times10^{-5}$ Torr or less was confirmed. Next, gas was discharged from the material, an EB-gun was used for heating, and then the shutter was opened to perform vapor deposition so that the thickness would be 70 nm.

Examples 2 to 4 and Comparative Examples 1 and 2

Examples 2 to 4 and comparative examples 1 and 2 differ from example 1 only in the composition ratio between Ag, Bi, and I contained in the $Ag_aBi_bI_c$ layer corresponding to the light-absorbing layer 13, and the other configurations and manufacturing process are the same as those in example 1. Thus, detailed description thereof is omitted.

Example 2 is prepared so that Ag:Bi:I is 2:5:17, and the composition ratio (b/a) in the composition formula $Ag_aBi_bI_c$ is 5/2 and satisfies c=a+3b.

Example 3 is prepared so that Ag:Bi:I is 1:3:10, and the composition ratio (b/a) in the composition formula $Ag_aBi_bI_c$ is 3 and satisfies c=a+3b.

Example 4 is prepared so that Ag:Bi:I is 1:4:13, and the composition ratio (b/a) in the composition formula $Ag_aBi_bI_c$ is 4 and satisfies c=a+3b.

Comparative example 1 is prepared so that Ag:Bi:I is 1:1:4, and the composition ratio (b/a) in the composition formula $Ag_aB_bI_c$ is 1 and satisfies c=a+3b.

Comparative example 2 is prepared so that Ag:Bi:I is 1:6:19, and the composition ratio (b/a) in the composition formula $Ag_aBi_bI_c$ is 6 and satisfies c=a+3b.

Example 5

Example 5 differs from example 1 only in the structure of layers corresponding to the lower conductive layer 11 and the electron transport layer 14, and the other configurations and manufacturing process are the same as those in example 1.

In example 5, an ITO glass substrate having a 1-μm-thick ITO layer formed thereon is substituted for an FTO glass substrate, and thus an ITO layer is formed on the lower conductive layer 11, instead of an FTO layer. Further, in example 5, a layer containing $C_{60}$ and PCBM is formed as the electron transport layer 14, instead of a $TiO_2$ layer. In example 5, an ITO glass substrate is used as the lower conductive layer 11, instead of an FTO glass substrate used in example 1 as the lower conductive layer 11. Further, in example 5, a layer containing $C_{60}$ and PCBM is used as the electron transport layer 14, instead of a $TiO_2$ layer used in example 1 as the electron transport layer 14.

The layer containing $C_{60}$ and PCBM was formed by spin coating. An electron transport layer precursor solution including an electron transport layer precursor and an organic solvent was applied by spin coating and dried. The electron transport layer precursor solution was made by mixing a solution of PCBM dissolved in chlorobenzene and a solution of $C_{60}$ dissolved in dichlorobenzene so that the volume ratio would be 1:1. The number of revolutions of spin coating was 1500 rpm, and the time of coating with the electron transport layer precursor solution was 30 second.

Table 1 shows the composition ratios of the $Ag_aBi_bI_c$ layer corresponding to the light-absorbing layer 13 and the structure of the hole transport layer 12 and the electron transport layer 14 in examples 1 to 5 and comparative examples 1 and 2.

TABLE 1

| | Ag | Bi | I | Hole transport layer | Electron transport layer |
|---|---|---|---|---|---|
| Example 1 | 1 | 2 | 7 | NiO:Zn | $TiO_2$ |
| Example 2 | 2 | 5 | 17 | NiO:Zn | $TiO_2$ |
| Example 3 | 1 | 3 | 10 | NiO:Zn | $TiO_2$ |
| Example 4 | 1 | 4 | 13 | NiO:Zn | $TiO_2$ |
| Example 5 | 1 | 2 | 7 | NiO:Zn | $C_{60}$ + PCBM |
| Comparative example 1 | 1 | 1 | 4 | NiO:Zn | $TiO_2$ |
| Comparative example 2 | 1 | 6 | 19 | NiO:Zn | $TiO_2$ |

TABLE 1-continued

| | Ag | Bi | I | Hole transport layer | Electron transport layer |
|---|---|---|---|---|---|

Figure 12:
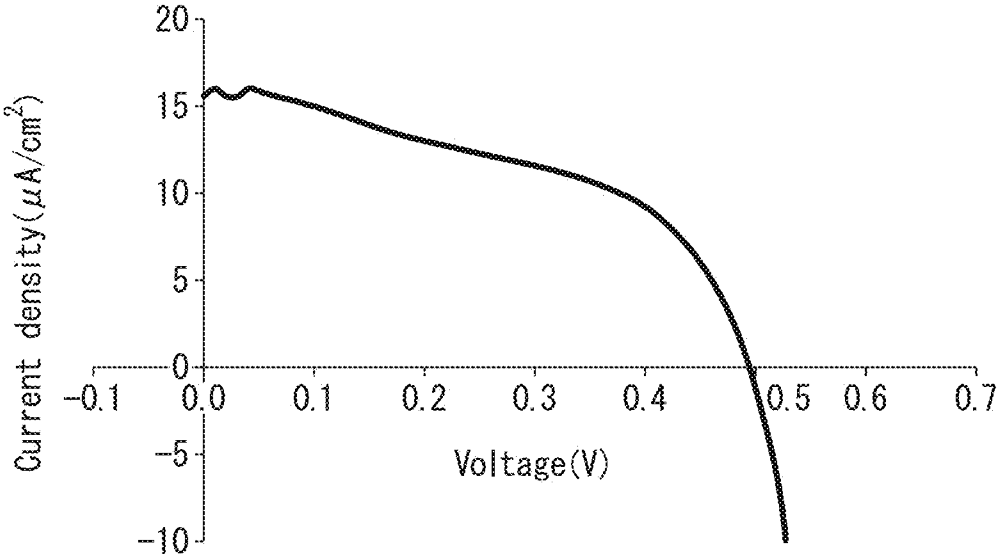
FIG. 12 shows current-voltage characteristics of a photoelectric conversion element according to example 1 under irradiation with light.
Figure 13:
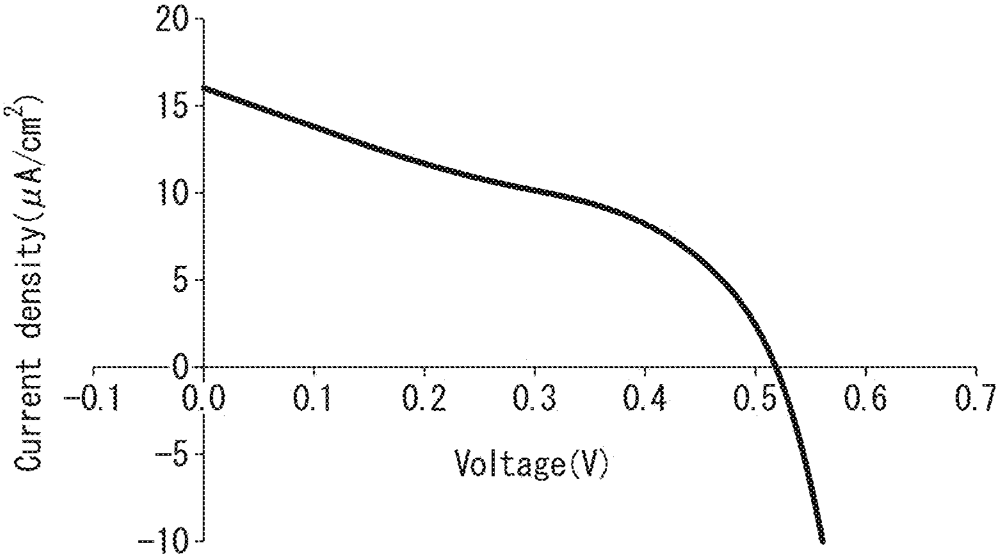
FIG. 13 shows current-voltage characteristics of a photoelectric conversion element according to example 2 under irradiation with light.
Figure 14:
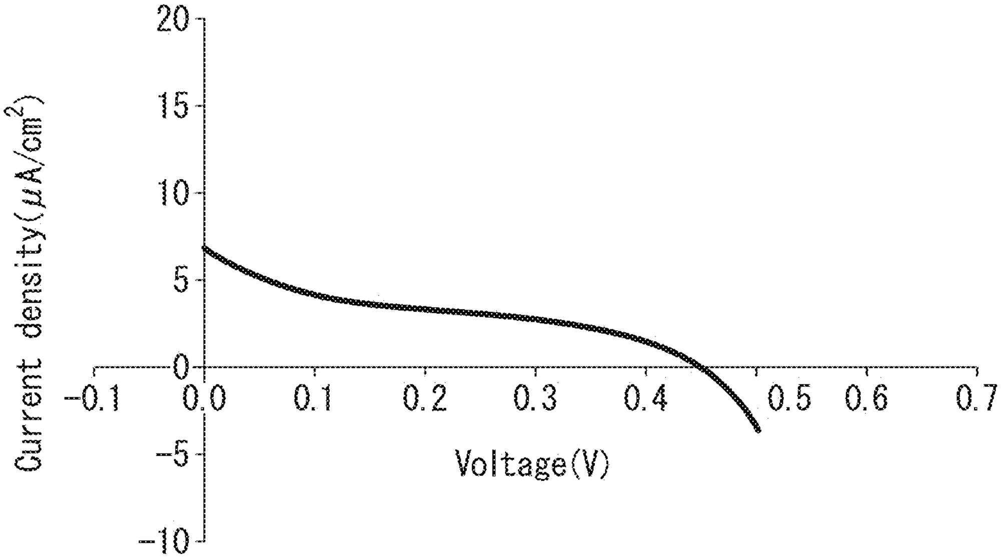
FIG. 14 shows current-voltage characteristics of a photoelectric conversion element according to example 3 under irradiation with light.
Figure 15:
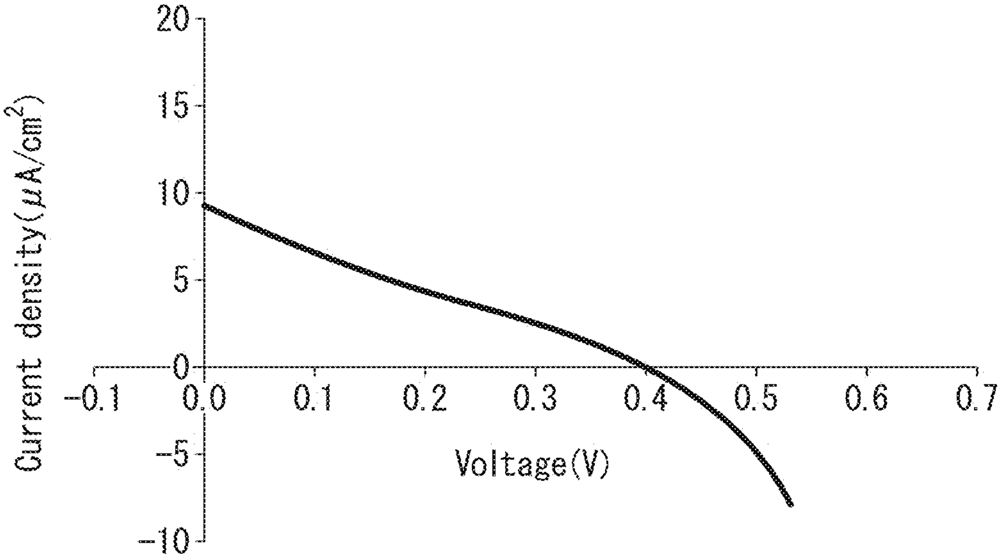
FIG. 15 shows current-voltage characteristics of a photoelectric conversion element according to example 4 under irradiation with light.
Figure 16:
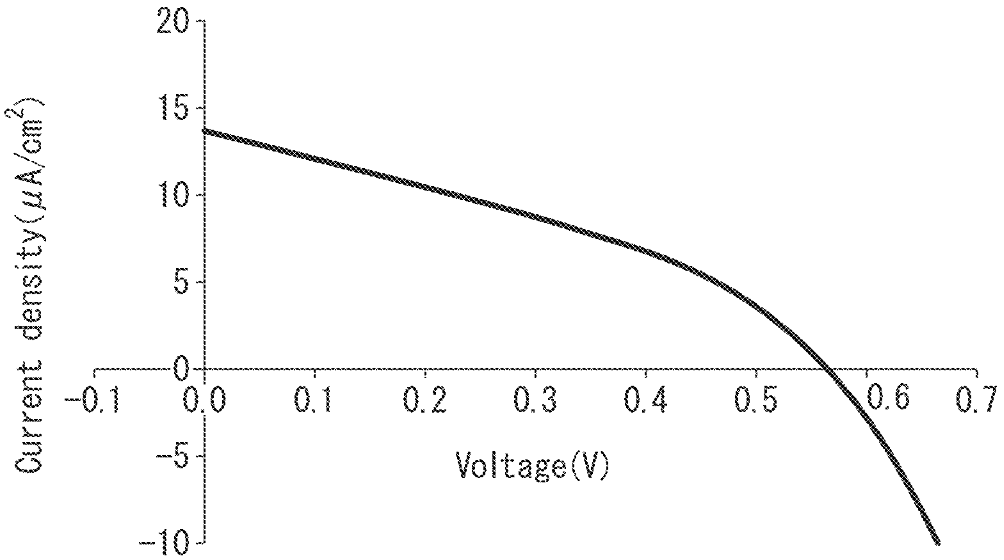
FIG. 16 shows current-voltage characteristics of a photoelectric conversion element according to example 5 under irradiation with light.
Figure 17:
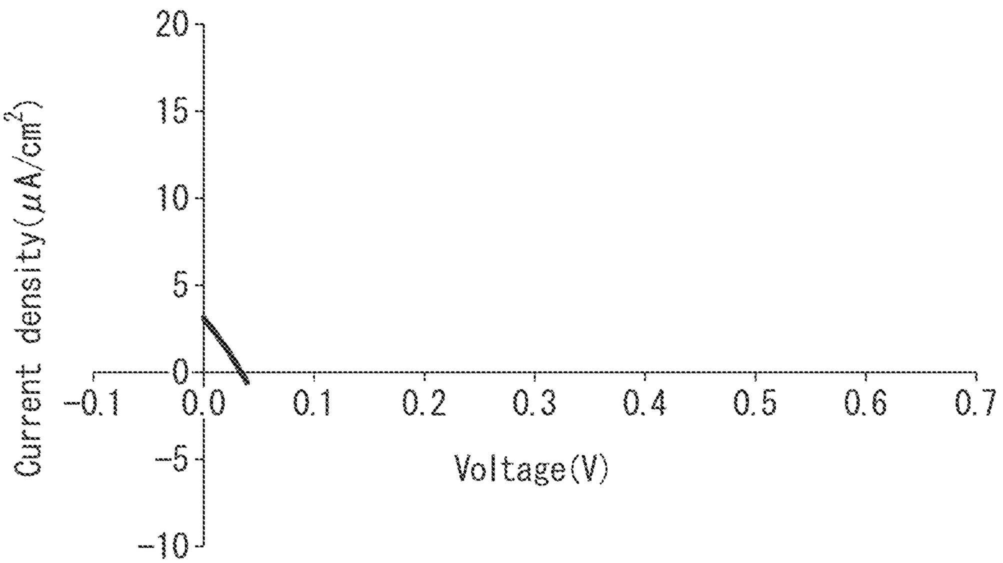
FIG. 17 shows current-voltage characteristics of a photoelectric conversion element according to comparative example 1 under irradiation with light.
Figure 18:
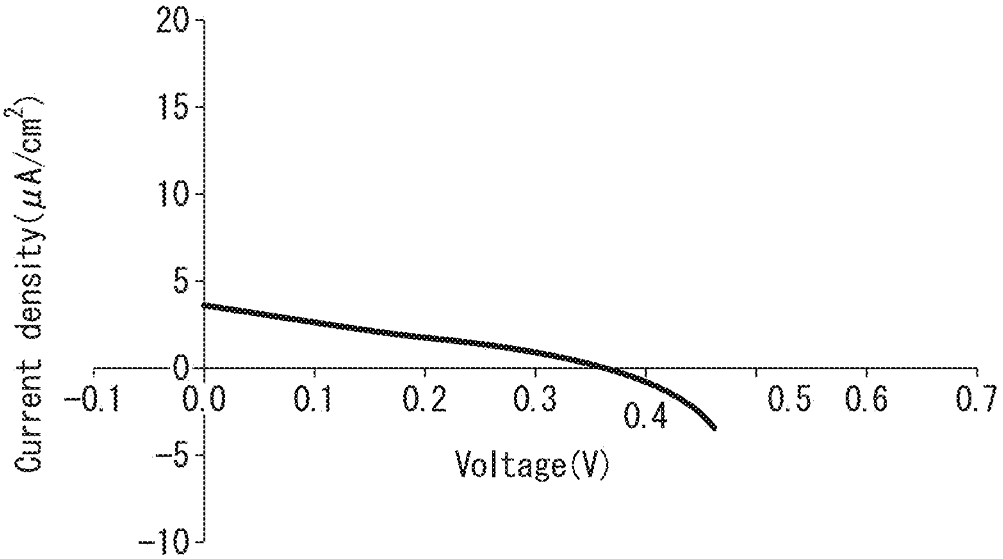
FIG. 18 shows current-voltage characteristics of a photoelectric conversion element according to comparative example 2 under irradiation with light.

FIG. 12 shows current-voltage characteristics of a photoelectric conversion element according to example 1 under irradiation with light. FIG. 13 shows current-voltage characteristics of a photoelectric conversion element according to example 2 under irradiation with light. FIG. 14 shows current-voltage characteristics of a photoelectric conversion element according to example 3 under irradiation with light. FIG. 15 shows current-voltage characteristics of a photoelectric conversion element according to example 4 under irradiation with light. FIG. 16 shows current-voltage characteristics of a photoelectric conversion element according to example 5 under irradiation with light. FIG. 17 shows current-voltage characteristics of a photoelectric conversion element according to comparative example 1 under irradiation with light. FIG. 18 shows current-voltage characteristics of a photoelectric conversion element according to comparative example 2 under irradiation with light. In FIG. 12 to 18, the abscissa represents voltage generated between the lower electrodes 15 and the upper electrodes 16 during irradiation with light, and the ordinate represents current flowing from the lower electrodes 15 during irradiation with light.

(Measurement Method of Current-Voltage Characteristics Under Irradiation with Light)

The current-voltage characteristics under irradiation with light were measured by the following method. As a light source was used BLD-100 available from Bunkoukeiki Co., Ltd., and illuminance was adjusted so that light incident on the photoelectric conversion element from the light source would be 200 Ix. Light emitted from the light source was adjusted with a light-shielding mask so as to be emitted to a region 2.5 mm by 2.5 mm, and the light source and the photoelectric conversion element were disposed so that light would be incident on the photoelectric conversion element from the substrate side of the photoelectric conversion element. The current-voltage characteristics were measured with PECK2400-N available from Peccell Technologies, Inc., by sweeping voltage applied to the photoelectric conversion element from the plus side to the minus side.

The conversion efficiency in example 1, in which the composition ratio a:b:c of the $Ag_aBi_bI_c$ film is 1:2:7 and the composition ratio (b/a) is 2, is 6.66%. The conversion efficiency in example 2, in which the composition ratio a:b:c of the $Ag_aBi_bI_c$ film is 2:5:17 and the composition ratio (b/a) is 2.5, is 5.86%. The conversion efficiency in example 3, in which the composition ratio a:b:c of the $Ag_aBi_bI_c$ film is 1:3:10 and the composition ratio (b/a) is 3, is 1.43%. The conversion efficiency in example 4, in which the composition ratio a:b:c of the $Ag_aBi_bI_c$ film is 1:4:13 and the composition ratio (b/a) is 4, is 156%. The conversion efficiency in example 5, in which the composition ratio a:b:c of the $Ag_aBi_bI_c$ film is 1:2:7, the composition ratio (b/a) is 2, and a layer containing $C_{60}$ and PCBM is formed as the electron transport layer 14, is 4.90%.

In examples 1 to 4, many electrons and holes are generated by being excited by light absorption in a region in the light-absorbing layer 13, where the composition ratio (b/a) satisfies 2≤b/a≤4, that adjoins the hole transport layer 12 and on which light is incident through the hole transport layer 12, as shown in FIG. 3. Further, a large internal electric field applied to the region where many electrons and holes are generated separates the generated electrons and holes, which makes recombination between electrons and holes unlikely to occur and increases the numbers of electrons and holes transported to the lower electrodes 15 and the upper electrodes 16, improving conversion efficiency.

In example 5, an ITO layer and a layer containing $C_{60}$ and PCBM respectively corresponding to the lower conductive layer 11 and the electron transport layer 14 are included unlike examples 1 to 4, but the composition ratio of the light-absorbing layer 13 satisfies 2≤b/a≤4, as in examples 1 to 4, which increases conversion efficiency. The layer containing $C_{60}$ and PCBM can be made at a lower temperature, and can also be made, for example, by coating.

The conversion efficiency in comparative example 1, in which the composition ratio a:b:c of the $Ag_aBi_bI_c$ film is 1:1:4 and the composition ratio (b/a) between Ag and Bi is 1, is 0.05%. The conversion efficiency in comparative example 2, in which the composition ratio a:b:c of the $Ag_aBi_bI_c$ film is 1:6:19 and the composition ratio (b/a) between Ag and Bi is 6, is 0.65%.

In comparative example 1, in which the composition ratio (b/a) between Ag and Bi is 1, the conversion efficiency is much lower than in examples 1 to 5, in which the composition ratio (b/a) of the light-absorbing layer 13 satisfies 2≤b/a≤4. In comparative example 1, since the difference between the work functions of the hole transport layer 12 and the light-absorbing layer 13 is small, a small internal electric field is generated, and thus many electrons and holes generated in a region in the light-absorbing layer 13 adjoining the hole transport layer 12 are unlikely to separate. In comparative example 1, recombination between electrons and holes is likely to occur, which reduces the numbers of electrons and holes transported to the lower electrodes 15 and the upper electrodes 16, causing reduction in conversion efficiency.

In comparative example 2, in which the composition ratio (b/a) between Ag and Bi is 6, the conversion efficiency is higher than in comparative example 1, but lower than in examples 1 to 5. In comparative example 2, a large internal electric field separates generated electrons and holes in a region in the light-absorbing layer 13 that adjoins the hole transport layer 12 and where many electrons and holes are generated, and thus recombination is unlikely to occur, as in examples 1 to 5. However, in the case where the composition ratio (b/a) is greater than 4, energy offset between the upper end of the valence band of the NiO:Zn layer corresponding to the hole transport layer 12 and that of the light-absorbing layer 13 is large, and thus a smaller internal electric field is generated than in examples 1 to 5. In comparative example 2, a small internal electric field generated in the region in the light-absorbing layer 13 adjoining the hole transport layer 12 reduces the open-circuit voltage and increases recombination between electrons and holes, which reduces the numbers of electrons and holes transported to the lower electrodes 15 and the upper electrodes 16, causing reduction in conversion efficiency. To commercialize photoelectric conversion elements, a high open-circuit voltage is desirable. More specifically, an open-circuit voltage of 0.4 V or higher is preferable. The open-circuit voltage in comparative example 2 is 0.36 V, which is less than 0.4 V, and is not preferable.

Figure 19:
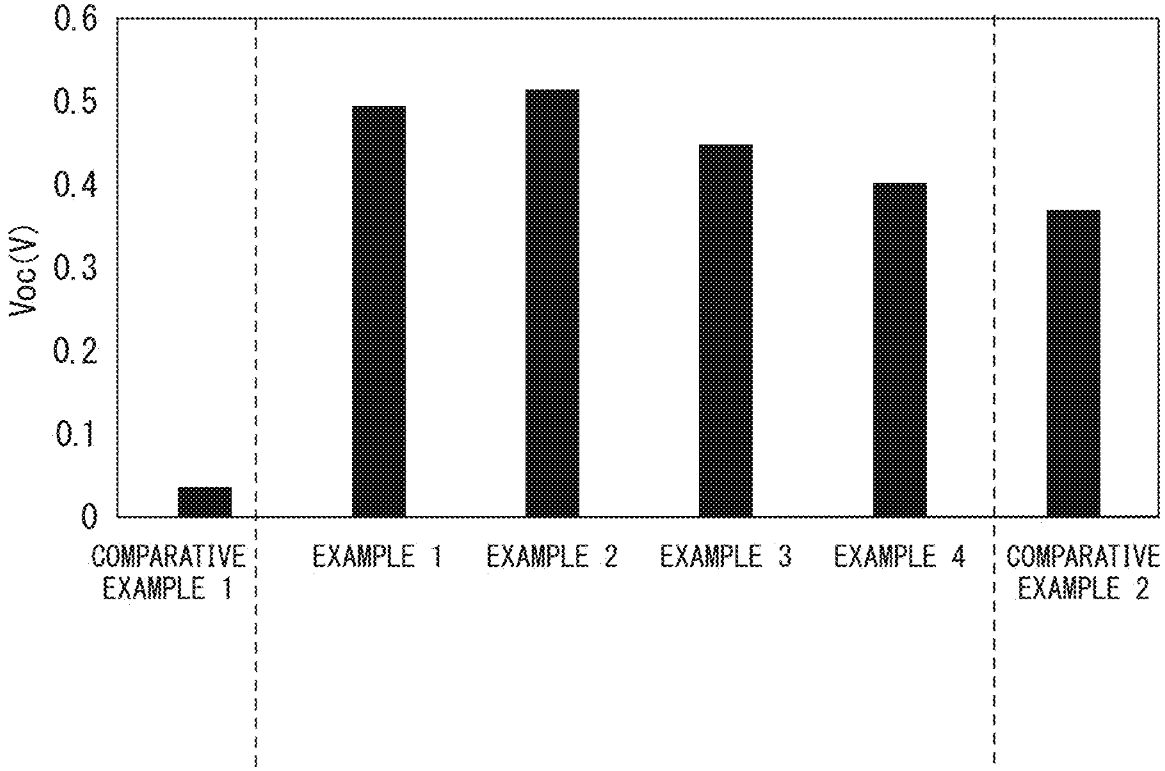
FIG. 19 shows open-circuit voltages $V_{OC}$ in the current-voltage characteristics of examples 1 to 4 and comparative examples 1 and 2.

FIG. 19 shows open-circuit voltages $V_{OC}$ in the current-voltage characteristics of examples 1 to 4 and comparative examples 1 and 2.

In comparative example 1, since the difference between the work functions of the hole transport layer 12 and the light-absorbing layer 13 is small, a small internal electric field is generated in the region in the light-absorbing layer 13 adjoining the hole transport layer 12, and thus electrons and holes are unlikely to separate in the region where many electrons and holes are generated. Since a small internal electric field is generated in the region in the light-absorbing layer 13 adjoining the hole transport layer 12, recombination of electrons and holes is likely to occur, and the open-circuit voltage $V_{OC}$ is reduced. In comparative example 2, energy offset between the upper end of the valence band of the NiO:Zn layer corresponding to the hole transport layer 12 and that of the light-absorbing layer 13 is large, and the open-circuit voltage $V_{OC}$ is reduced. In examples 1 to 4, the open-circuit voltage $V_{OC}$ is higher than 0.4 V In examples 1 and 2, in which the composition ratio (b/a) between Ag and Bi is 2≤b/a≤2.5, the open-circuit voltage $V_{OC}$ is the highest, and it is further preferable that the photoelectric conversion element include a light-absorbing layer in which the composition ratio (b/a) between Ag and Bi is 2≤b/a≤2.5.

(Laminated Film)

Figure 20:
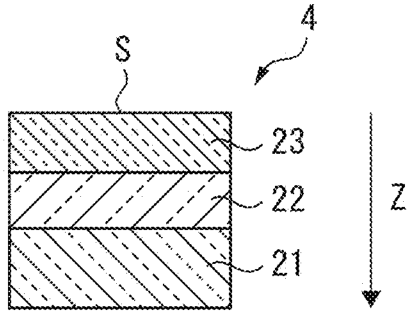
FIG. 20 is a cross-sectional view schematically showing a laminated film.

FIG. 20 is a cross-sectional view schematically showing a laminated film 4. The laminated film 4 includes a hole transport layer excelling in transmittance and electrical conductivity. The laminated film 4 includes a substrate 21, a first conductive layer 22, and a hole transport layer 23 laminated in this order. The laminated film 4 can be applied to a photoelectric conversion element by further laminating a light-absorbing layer, an electron transport layer, and a second conductive layer in this order on the hole transport layer 23. A photoelectric conversion element including the laminated film 4 is an inverted photoelectric conversion element to be irradiated with light from the substrate 21 side.

In the laminated film 4, the specific amounts of nickel (Ni), oxygen (O), and zinc (Zn) are contained in the whole hole transport layer 23 by Zn-doping, and a particular amount of O is contained near the surface of the hole transport layer 23 by UV ozone treatment. The hole transport layer 23 of the laminated film 4 inhibits reduction in translucency, improves hole transport properties, excels in translucency and electrical conductivity, and can be suitably applied to an inverted photoelectric conversion element.

The substrate 21 is a translucent substrate formed of a translucent member, such as glass and plastic, and can serve as a window layer for guiding light incident on a surface thereof to the light-absorbing layer. The substrate 21 may be formed of a synthetic resin having flexibility, such as polyimide resin. The substrate 21 has a thickness, for example, from 0.1 mm to 5.0 mm inclusive.

The first conductive layer 22 is a translucent conductive layer formed of a transparent conductive oxide, such as fluorine-doped tin oxide (FTO), aluminum-doped zinc oxide (AZO), and niobium-doped titanium oxide (TNO). The first conductive layer 22, also referred to as a lower conductive layer, is formed on the substrate 21, thereby being disposed with a surface in contact with the other surface of the substrate 21. The first conductive layer 22 may be formed of a single transparent conductive oxide or two transparent conductive oxides. The first conductive layer 22 is a window layer for guiding light and an electrode layer for efficiently extracting holes obtained from the light-absorbing layer. The first conductive layer 22 preferably has a thickness from 0.01 μm to 10.0 μm inclusive.

The hole transport layer 23 has a thickness, for example, from 5 nm to 500 nm inclusive.

The hole transport layer 23 includes Zn-doped nickel oxide, and is formed on the first conductive layer 22, thereby being disposed with a surface in contact with the other surface of the first conductive layer 22. In the hole transport layer 23, the percentage of Ni is from 30 at % to 40 at % inclusive, the percentage of O is from 55 at % to 60 at % inclusive, and the percentage of Zn is from 3 at % to 15 at % inclusive. The percentage of Ni is preferably from 32 at % to 38 at % inclusive, the percentage of O is preferably from 57 at % to 59 at % inclusive, and the percentage of Zn is preferably from 4 at % to 10 at % inclusive. The sum of the percentages of Ni, O, and Zn is 100 at %. When the percentage of Zn is less than 4 at %, the effect of Zn-doping may not be produced. When the percentage of Zn is greater than 15 at %, the conversion efficiency of a photoelectric conversion element including the hole transport layer 23 may be reduced. The percentages of Ni, O, and Zn are obtained by X-ray photoelectron spectroscopy analysis of the laminated film 4.

In the hole transport layer 23, X-ray photoelectron spectroscopy analysis made in the depth direction, also referred to as Z-direction, from a surface S of the hole transport layer 23 remote from the first conductive layer 22 shows that the percentage of O is 56.5 at % or greater from the surface S to a depth of 20 nm. In the hole transport layer 23, the percentage of O is preferably 57.0 at % or greater from the surface S to a depth of 20 nm. When the hole transport layer 23 has a thickness from 60 nm to 500 nm inclusive, the percentage of O is 56.5 at % or greater from the surface S to a depth of 20 nm. When the hole transport layer 23 has a thickness from 60 nm to 500 nm inclusive, the percentage of O is preferably 57.0 at % or greater from the surface S to a depth of 20 nm.

In the hole transport layer 23, X-ray photoelectron spectroscopy analysis made in the depth direction from the surface S of the hole transport layer 23 shows that the percentage of O is 56.5 at % or greater from the surface S to a depth of ⅓ of the film thickness of the hole transport layer 23. In the hole transport layer 23, the percentage of O is preferably 57.0 at % or greater from the surface S to a depth of ⅓ of the film thickness of the hole transport layer 23. When the hole transport layer 23 has a thickness from 5 nm to 60 nm inclusive, the percentage of O is preferably 57.0 at % or greater from the surface S to a depth of ⅓ of the film thickness of the hole transport layer 23.

An atomic percentage is calculated by excluding measured values on the outermost surface affected, for example, by surface impurity and at depths near an interface affected by a chemical element included in a lower layer from measured values of analysis in the depth direction of a whole atomic layer, and then averaging measured values obtained at depths d0, d1, d2, d3, . . . , dn ($4 \leq n$) spaced at particular intervals. Regarding the percentage of O near the surface of the hole transport layer 23, all measured values of analysis in the depth direction of the vicinity of the surface obtained at depths d0, . . . , dm spaced at particular intervals ($1 \leq m$, dm is a depth of 20 nm) except a measured value on the outermost surface affected, for example, by surface impurity are 56.5 at % or greater. Regarding the percentage of O near the surface of the hole transport layer 23, all measured values of analysis in the depth direction of the vicinity of the surface obtained at depths do, . . . , dm spaced at particular intervals ($1 \leq m$, dm is a depth of ⅓ of the film thickness of the hole transport layer) except a measured value on the outermost surface affected, for example, by surface impurity are 56.5 at % or greater.

The specific amounts of Ni, O, and Zn are included in the hole transport layer 23 as a whole by Zn-doping, and further, a particular amount of O is included near the surface of the hole transport layer 23, which inhibits reduction in transmittance and improves hole transport properties.

The atomic percentages of the hole transport layer 23 are calculated from values measured by X-ray photoelectron spectroscopy analysis of the hole transport layer 23 laminated on the substrate 21 and the first conductive layer 22. When other layers are laminated on the hole transport layer 23, X-ray photoelectron spectroscopy analysis is made after the surface of the hole transport layer 23 is exposed by removing the layers laminated on the hole transport layer 23. Specifically, the layers laminated on the hole transport layer 23 are a light-absorbing layer, an electron transport layer, and a second conductive layer.

The electrical conductivity of the hole transport layer 23 is preferably from 0.0001 S/in to 0.01 S/m inclusive. The transmittance of the hole transport layer 23 is preferably 60% or greater. The hole transport layer 23 of the laminated film 4 has high transmittance and electrical conductivity. The electrical conductivity and transmittance of the hole transport layer 23 are values measured when the hole transport layer 23 is laminated on the substrate 21 and the first conductive layer 22. When other layers are laminated on the hole transport layer 23, the electrical conductivity and transmittance are measured after the surface of the hole transport layer 23 is exposed by removing the layers laminated on the transport layer 23. The layers laminated on the hole transport layer 23 are a light-absorbing layer, an electron transport layer, and a second conductive layer.

Third Embodiment

Figure 21:
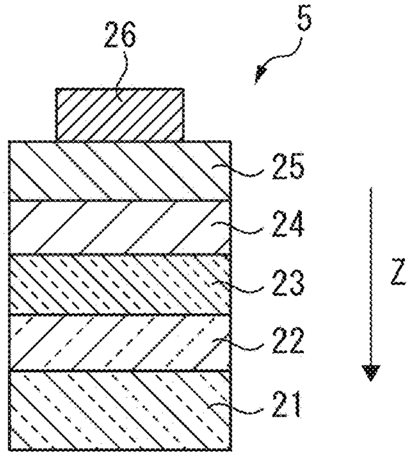
FIG. 21 is a cross-sectional view of a photoelectric conversion element according to a third embodiment.

FIG. 21 is a cross-sectional view schematically showing a photoelectric conversion element 5 to which the above laminated film 4 is applied, as a third embodiment. The laminated film 4 can be suitably applied to the photoelectric conversion element of the embodiment. The photoelectric conversion element 5 includes the laminated film 4. More specifically, the photoelectric conversion element 5 further includes a light-absorbing layer 24, an electron transport layer 25, and a second conductive layer 26 laminated in this order on the laminated film 4 including the substrate 21, the first conductive layer 22, and the hole transport layer 23. The light-absorbing layer 24 is laminated on the hole transport layer 23 of the laminated film 4, thereby being disposed with a surface in contact with the other surface of the hole transport layer 23. The electron transport layer 25 is laminated on the light-absorbing layer 24, thereby being disposed with a surface in contact with the other surface of the light-absorbing layer 24. The second conductive layer 26 is laminated on the electron transport layer 25, thereby being disposed with a surface in contact with the other surface of the electron transport layer 25. The photoelectric conversion element 5 is of the inverted type to be irradiated with light from the substrate 21 side. Since the substrate 21, the first conductive layer 22, and the hole transport layer 23 in the photoelectric conversion element 5 have been described with reference to FIG. 20, detailed description thereof is omitted herein.

The light-absorbing layer 24 is formed on the hole transport layer 23, and absorbs light incident through the substrate 21, the first conductive layer 22, and the hole transport layer 23 to generate electrons and holes. The light-absorbing layer 24 includes, for example, an organic lead halide perovskite compound, or a Ag/Bi-based material in which silver bismuth is used as a cation instead of lead.

The organic lead halide perovskite compound included in the light-absorbing layer 24 is, for example, a compound expressed by $(RNH_3)_nPbI_{(2+n)}$. R denotes a hydrocarbon radical, and n is 1 or 2. Specifically, examples of a compound expressed by $(RNH_3)_nPbI_{(2+n)}$ include $(CH_3NH_3)Pb_{13}$, $(CH_3CH_2NH_3)Pb_{13}$, $(C_6H_5C_2H_4NH_3)_2Pb_{14}$, $(C_{10}H_7CH_3NH_3)_2Pb_{14}$, and $(C_4HgC_2H_4NH_3)_2Pb_{14}$. The light-absorbing layer 24 may include a single organic lead halide perovskite compound or two or more organic lead halide perovskite compounds. The Ag/Bi-based material included in the light-absorbing layer 24 is, for example, a compound having composition expressed by AaBbXz. A is Ag, Cu, Au, In, Na, K, or $NH_4$. B is Bi, Sb, Ga, In, TI, or La. X is F, Cl, Br, I, CN, or SCN. The composition formula AaBbXz satisfies $(a+3b)\times0.8\leq z\leq(a+3b)\times1.2$. (a,b) is (1,1), (3,1), (1,3), (2,1), (7,1), (9,1), (5,1), (1,2), or (5,3). However, a and b may have an error resulting from defects included in a crystal or difference in phase. The light-absorbing layer 24 may include a single Ag/Bi-based material or two or more Ag/Bi-based materials. The light-absorbing layer 24 preferably has a thickness from 100 nm to 1000 nm inclusive.

The electron transport layer 25 includes a metal oxide, such as titanium oxide (e.g., $TiO_2$), tin oxide (e.g., $SnO_2$), tungsten oxide (e.g., $WO_2$, $WO_3$, $W_2O_3$), zinc oxide (ZnO), strontium titanate (e.g., $SrTiO_3$), and aluminum oxide ($Al_2O_3$), and is formed on the light-absorbing layer 24. The electron transport layer 25 may include a single metal oxide or two or more metal oxides. The electron transport layer 25 may include a C-based semiconductor, such as fullerene ($C_{60}$) or phenyl-$C_{61}$-butyric acid methyl ester (PCBM). In terms of electron transport properties, the electron transport layer 25 preferably includes titanium oxide. The crystalline state of titanium oxide included in the electron transport layer 25 is preferably anatase. The electron transport layer 25 preferably has a thickness from 10 nm to 1500 nm inclusive.

The second conductive layer 26 is formed of, for example, silver, aluminum, zinc, or titanium, on the electron transport layer 25. The second conductive layer 26 may be formed of, for example, an alloy of metals, such as silver, aluminum, zinc, and titanium. The second conductive layer 26 preferably has a thickness from 0.01 μm to 2.0 μm inclusive.

(Manufacturing Method of Another Modified Example of the Third Embodiment)

In a manufacturing method of the laminated film 4, a first conductive layer 22 and a hole transport layer 23 are laminated in this order on a substrate 21.

First, a first conductive layer 22 is formed on a substrate 21 by vacuum deposition, sputtering, or plating.

Next, a hole transport layer making step is performed in which a layer including Zn-doped nickel oxide, also referred to as a Zn-doped NiO layer, is formed on the first conductive layer 22, and the formed layer is UV ozone treated to form a hole transport layer 23. In the hole transport layer making step, NiO powder and ZnO powder are mixed, pressed, and then burned from 1200° C. to 1400° C. inclusive for 1 hours to 3 hours inclusive to obtain a tablet. The obtained tablet is used to form a Zn-doped NiO layer by vacuum deposition, sputtering, or the like.

Next, for example, the Zn-doped NiO layer is irradiated with ultraviolet rays under an atmosphere of an oxygen-containing gas to ozone treat the formed Zn-doped NiO layer. A light source for irradiation with ultraviolet rays is, for example, a low-pressure mercury lamp. The oxygen-containing gas may be any gas including oxygen, and is air, oxygen, or a mixture of oxygen and an inert gas, such as nitrogen and argon; and air is preferable. The processing time of UV ozone treatment corresponding to the irradiation time of ultraviolet rays is, for example, from 5 minutes to 30 minutes inclusive.

For example, the percentages of Ni, O, and Zn in the whole hole transport layer 23 can be adjusted by appropriately modifying the ratio between NiO powder and ZnO powder mixed when a tablet is made. The amount of O near the surface of the hole transport layer 23 can be adjusted by appropriately modifying the conditions of UV ozone treatment.

A Zn-doped NiO layer not yet UV ozone treated improves in electrical conductivity by Zn-doping. By being UV ozone treated, a Zn-doped NiO layer can be inhibited from coloring and further improve in electrical conductivity. In this way, the hole transport layer 23 improves in both translucency and electrical conductivity by the above hole transport layer making step.

Before UV ozone treatment, the Zn-doped NiO layer has a small amount of O near the surface of the Zn-doped NiO layer. By UV ozone treatment of the Zn-doped NiO layer, O enters the surface of the Zn-doped NiO layer and is supplied to the vicinity of the surface of the Zn-doped NiO layer. The specific amounts of Ni, O, and Zn are included in the whole hole transport layer 23, and a particular amount of O is included near the surface of the hole transport layer 23, which enables the hole transport layer 23 of the laminated film 4 to have both translucency and electrical conductivity.

The resistance of nickel oxide can be reduced by being doped with Co or Cu. However, UV ozone treatment after doping with Co or Cu gives a deep color to nickel oxide, and thus reduces its translucency. The combination of Zn-doping and ozone treatment in the above hole transport layer making step enables the hole transport layer 23 to have both translucency and electrical conductivity.

Manufacturing Method of a Modified Example of a Third Embodiment

In a manufacturing method of the photoelectric conversion element 5, a first conductive layer 22, a hole transport layer 23, a light-absorbing layer 24, an electron transport layer 25, and a second conductive layer 26 are laminated in this order on a substrate 21. Since the laminating steps of the first conductive layer 22 and the hole transport layer 23 in a manufacturing method that is the same as that of the photoelectric conversion element 5 are similar to those described in a manufacturing method that is the same as that of the laminated film 4, detailed description thereof is omitted herein.

Modified Example of the Third Embodiment

The light-absorbing layer 24 can be formed on the hole transport layer 23 by spin coating. The electron transport layer 25 can be formed on the light-absorbing layer 24 by spray pyrolysis or spin coating. The second conductive layer 26 can be formed on the electron transport layer 25 by vacuum deposition, sputtering, plating, or the like, similarly to the first conductive layer 22.

Examples of Application of the Third Embodiment

The laminated film 4 and the photoelectric conversion element 5 may include a layer other than the substrate 21 to the second conductive layer 26. For example, the photoelectric conversion element 5 may further include a surface layer on the second conductive layer 26. The laminated film 4 and the photoelectric conversion element 5 may include a buffer layer or a passivation layer between every two layers to improve characteristics of the interfaces between the layers. The laminated film 4 and the photoelectric conversion element 5 may include an interdiffusion inhibiting layer that is a $SiO_2$ layer formed between the hole transport layer 23 and the light-absorbing layer 24 and that inhibits interdiffusion of chemical elements contained in the hole transport layer 23 and the light-absorbing layer 24.

(Solar Cell Module and Mobile Device According to the Embodiment)

The photoelectric conversion element 5 is suitably used for a solar cell module. A solar cell module including the photoelectric conversion element 5 is suitably used for a mobile device. A solar cell module according to the embodiment includes the photoelectric conversion element 5, and a mobile device according to the embodiment includes a solar cell module including the photoelectric conversion element 5. Specifically, examples of a mobile device include a wristwatch, a pocket watch, a gyro sensor, an atmospheric pressure sensor, a hearing aid, a hand-held GPS, a digital camera, a video camera, a portable audio player, an IC recorder, a portable video player, a pocket computer, a calculator, a portable game machine, a notebook computer, a PDA, a smartphone, a portable printer, a portable scanner, a portable modem, an information appliance such as an electronic dictionary, a mobile phone, a satellite phone, a Pocket bell (registered trademark) or a pager, a portable radio, a portable TV, a device supporting one-segment broadcasting or terrestrial digital TV broadcasting, an IC card with a built-in processor, and a communication device such as an RFID tag. A solar cell module and a mobile device of the embodiment can be manufactured with the above photoelectric conversion element by a known method.

In view of the above, the present disclosure relates to the following.

[1]A laminated film including a substrate, a first conductive layer, and a hole transport layer laminated in this order, wherein the hole transport layer includes Zn-doped nickel oxide; the percentage of Ni is from 30 at % to 40 at % inclusive, the percentage of O is from 55 at % to 60 at % inclusive, and the percentage of Zn is from 3 at % to 15 at % inclusive (the sum of the percentages of Ni, O, and Zn is 100 at %); and the percentage of O is 56.5 at % or greater from a surface of the hole transport layer to a depth of 20 nm in a depth direction or from the surface to a depth of ⅓ of the film thickness of the hole transport layer (the sum of the percentages of Ni, O, and Zn is 100 at %).

[2] The laminated film according to [1], wherein the percentages of Ni, O, and Zn are values obtained by X-ray photoelectron spectroscopy analysis.

[3] The laminated film according to [1] or [2], wherein the hole transport layer has an electrical conductivity from 0.0001 S/m to 0.01 S/m inclusive.

[4] The laminated film according to any one of [1] to [3], wherein the hole transport layer has a transmittance of 60% or greater.

[5] The laminated film according to any one of [1] to [4], wherein the hole transport layer has a thickness from 5 nm to 500 nm inclusive.

[6] The laminated film according to any one of [1] to [5], wherein the hole transport layer is obtained by laminating a layer with Zn-doped nickel oxide on the first conductive layer and UV ozone treating the layer with Zn-doped nickel oxide.

[7]A manufacturing method of a laminated film including a substrate, a first conductive layer, and a hole transport layer laminated in this order, the method including a hole transport layer making step in which a layer with Zn-doped nickel oxide is laminated on the first conductive layer and UV ozone treated to obtain the hole transport layer.

[8] The manufacturing method according to [7], wherein the hole transport layer includes the Zn-doped nickel oxide; the percentage of Ni is from 30 at % to 40 at % inclusive, the percentage of O is from 55 at % to 60 at % inclusive, and the percentage of Zn is from 3 at % to 15 at % inclusive (the sum of the percentages of Ni, O, and Zn is 100 at %); and the percentage of O is 56.5 at % or greater from a surface of the hole transport layer to a depth of 20 nm in a depth direction or from the surface to a depth of ⅓ of the film thickness of the hole transport layer (the sum of the percentages of Ni, O, and Zn is 100 at %).

A laminated film including a hole transport layer excelling in translucency and electrical conductivity is obtained by the manufacturing methods of [7] and [8] above.

[9]A photoelectric conversion element further including a light-absorbing layer, an electron transport layer, and a second conductive layer laminated in this order on the laminated film according to any one of [1] to [5].

[10]A solar cell module including the photoelectric conversion element according to [9].

[11]A mobile device including the solar cell module according to [10].

The above laminated film, which includes a hole transport layer excelling in translucency and dielectricity, is suitably used for a photoelectric conversion element, a solar cell module, and a mobile device.

Example of the Third Embodiment

Laminated films or photoelectric conversion elements according to an example of the third embodiment and comparative examples were manufactured, and composition analysis and measurement were performed.

Example 6

As a material was used a tablet-shaped one made by mixing NiO powder (special grade chemical) and ZnO powder (special grade chemical) in a mortar, pressing the mixture, and then burning it at 1200° C. for 3 hours. A tablet described above was used because powdered NiO would spit and be scattered when heated with an EB-gun.

EX-200 available from ULVAC, Inc., a small evaporator for experimental use, was used; the distance to a substrate was set to 280 mm; as the substrate was used a 25-by-25-mm ITO glass substrate having a highly conductive Sn-doped $In_2O_3$ thin film bonded thereon. A quartz crystal thickness monitor was used to control the film thickness. The substrate was placed on a metallic mask having a 25-by-25-mm opening; the tablet was filled in a water-cooled hearth; after evacuation down to $4\times10^{-4}$ Torr or less, gas was discharged from the material; after setting the power of an EB-gun to 8 kV (const)×45 mA, the shutter was opened to perform vapor deposition. Without any special control of gas pressure and substrate temperature during vapor deposition, a film was formed, while being monitored with a quartz crystal thickness monitor, until the thickness reached 60 nm. In this way, a Zn-doped NiO layer (not yet UV ozone treated) was made on the ITO glass substrate.

Next, PL160-110 available from SEN LIGHTS Corporation, a table-top device for UV ozone treatment, was used; a sample having a Zn-doped NiO layer (not yet UV ozone treated) formed thereon was placed in the device so that the distance between the lamp and the sample would be 100 mm; and UV ozone treatment was performed for 10 minutes with the atmosphere in the device being evacuated at 1.2 m/sec. Since too much evacuation reduces the effect of treatment, the time and amount of evacuation were appropriately controlled. In this way, a sample having a Zn-doped NiO layer (UV ozone treated) formed on the ITO glass substrate as a hole transport layer was made.

Comparative Example 3

A sample having a Zn-doped NiO layer (not UV ozone treated) formed on an ITO glass substrate as a hole transport layer was made in the same manner as in example 6 except that UV ozone treatment was not performed.

Comparative Example 4

As a material was used a tablet-shaped one made by pressing NiO powder (special grade chemical) and then burning it at 1200° C. for 3 hours.

EX-200 available from ULVAC, Inc., a small evaporator for experimental use, was used; the distance to a substrate was set to 280 mm; as the substrate was used a 25-by-25-mm ITO glass substrate having a highly conductive Sn-doped $In_2O_3$ thin film bonded thereon. A quartz crystal thickness monitor was used to control the film thickness. The substrate was placed on a metallic mask having a 25-by-25-mm opening; the tablet was filled in a water-cooled hearth; after evacuation down to $4\times10^{-4}$ Torr or less, gas was discharged from the material; after setting the power of an EB-gun to 8 kV (const)×45 mA, the shutter was opened to perform vapor deposition. Without any special control of gas pressure and substrate temperature during vapor deposition, a film was formed, while being monitored with a quartz crystal thickness monitor, until the thickness reached 60 nm. In this way, a NiO layer (not doped with Zn or UV ozone treated) was made on the ITO glass substrate.

Next, PL160-110 available from SEN LIGHTS Corporation, a table-top device for UV ozone treatment, was used; a sample having a NiO layer (not doped with Zn or UV ozone treated) formed thereon was placed in the device so that the distance between the lamp and the sample would be 100 mm; and UV ozone treatment was performed for 10 minutes with the atmosphere in the device being evacuated at 1.2 m/sec. Since too much evacuation reduces the effect of treatment, the time and amount of evacuation were appropriately controlled. In this way, a sample having a NiO layer (not doped with Zn but UV ozone treated) formed on the ITO glass substrate as a hole transport layer was made.

Comparative Example 5

A sample having a NiO layer (not doped with Zn or UV ozone treated) formed on an ITO glass substrate as a hole transport layer was made in the same manner as in comparative example 4 except that UV ozone treatment was not performed.

(Measurement Method)

(Composition Analysis)

As samples for composition analysis, a NiO thin film or a NiO:Zn thin film (Zn-doped NiO thin film) was made on glass substrates in the same manner as in example 6 and comparative examples 3 to 5. More specifically, for composition analysis, four samples were prepared: glass substrate/NiO:Zn (UV treated), glass substrate/NiO:Zn (not UV treated), glass substrate/NiO (UV treated), and glass substrate/NiO (not UV treated). The composition of only Ni, O, Zn, Si, and C was analyzed, using a glass substrate as the substrate of the samples for composition analysis. The atomic percentages obtained by composition analysis are probably the same as those in the hole transport layer of the samples made on ITO glass substrates.

Nexsa available from Thermo Fisher Scientific, an X-ray photoelectron spectroscopy (XPS) device, was used for composition analysis. Kα of Al was used as an X-ray radiation source with the diameter of a radiated beam being set to 400 μmφ; and a flood gun was used for measurement. To investigate the distribution in the depth direction, measurement was made by narrow scanning every 120 seconds while the sample was being dug by sputtering with Ar.

In composition analysis, scanning measurement was made from an un-etched surface until the etching time was approximately 3000 seconds. In composition analysis of the whole hole transport layer, an average of values measured in the composition analysis while the etching time was approximately from 120 to 1440 seconds was used as a value for the samples that were doped with Zn, and an average of values measured while the etching time was approximately from 120 to 720 seconds was used as a value for the samples that were not doped with Zn. As the O percentage near the surface of the hole transport layer, an average of values measured while the etching time was approximately from 120 to 480 seconds was used for the samples that were doped with Zn, and an average of values measured while the etching time was approximately from 120 to 240 seconds was used for the samples that were not doped with Zn.

(Electrical Conductivity)

Figure 22:
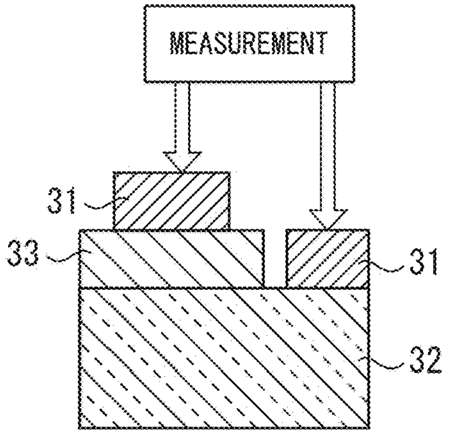
FIG. 22 is a diagram for describing how to measure current and voltage (part 1).
Figure 23:
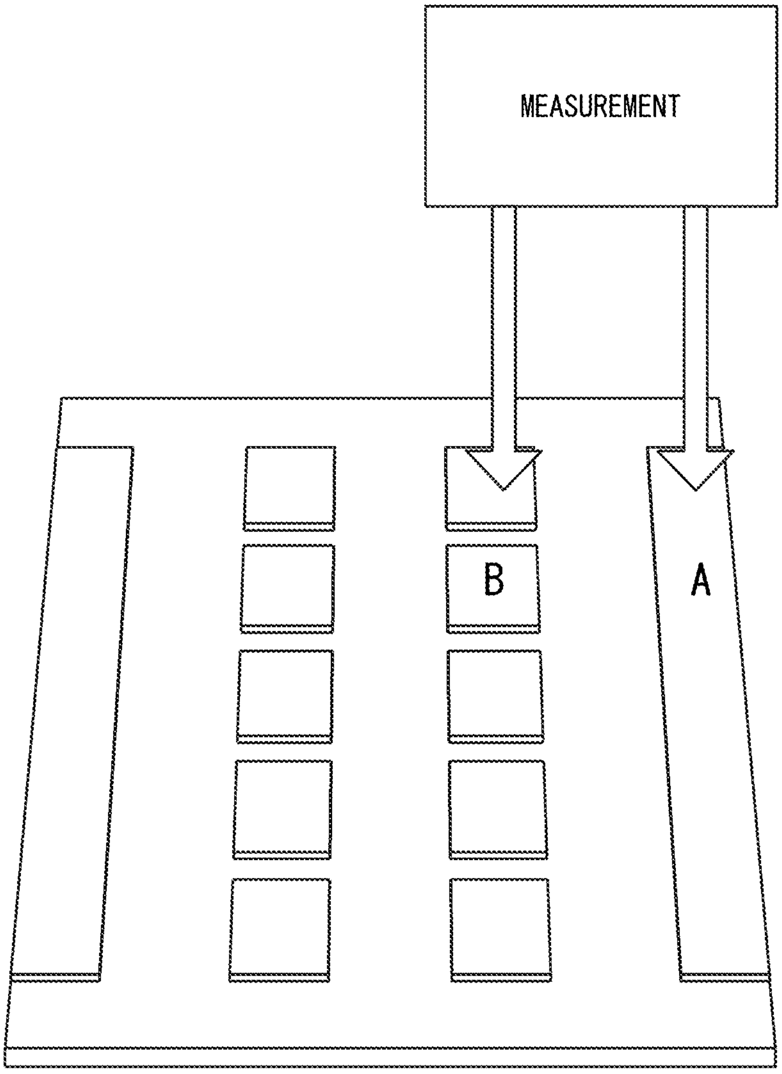
FIG. 23 is a diagram for describing how to measure current and voltage (part 2).

FIGS. 22 and 23 are diagrams for describing how to measure current and voltage. First, a sample having gold electrodes 31 deposited thereon was made for measurement of electrical characteristics (I-V measurement). The sample for measurement of electrical characteristics was made by depositing a hole transport layer 33 and the gold electrodes 31 on an ITO glass 32 like that described above, in the same manner as in example 6 and comparative examples 3 to 5. To deposit the gold electrodes 31, EX-200 available from ULVAC, Inc. was used; the distance to a substrate was set between 150 and 300 mm; a quartz crystal thickness monitor was used to control the film thickness.

More specifically, a sample having a NiO thin film or a NiO:Zn thin film formed on an ITO glass substrate was placed on a metallic mask having a predetermined opening; gold having a diameter of 1 to 2 mm was filled in a water-cooled hearth; after evacuation down to $4\times10^{-4}$ Torr or less, gas was discharged from the material; after setting the power of an EB-gun to 5 to 8 kV (const)×(40 to 60) mA, the shutter was opened to perform vapor deposition. Without any special control of gas pressure and substrate temperature during vapor deposition, a film was formed, while being monitored with a quartz crystal thickness monitor, until the thickness reached 70 nm.

Next, current and voltage of the obtained sample for measurement of electrical characteristics was measured with Source Meter 2401 available from KEYTHLEY More specifically, by bringing a metallic probe for measurement into contact with metal electrodes A and B bonded to the sample, current and voltage were measured to obtain electrical conductivity.

(Transmittance)

To measure transmittance were used the samples made with an ITO glass substrate in example 6 and comparative examples 3 to 5. With UV-1900 available from Shimadzu Corporation, an ultraviolet and visible spectrophotometer, transmittance of these samples was measured at I-nm intervals at a scan speed of 1 nm/sec in the wavelength range from 1000 to 200 nm. Measured values from 380 nm to 600 nm in the visible light range below the band gap were employed as transmittance.

(Results of Measurement)

Figure 24:
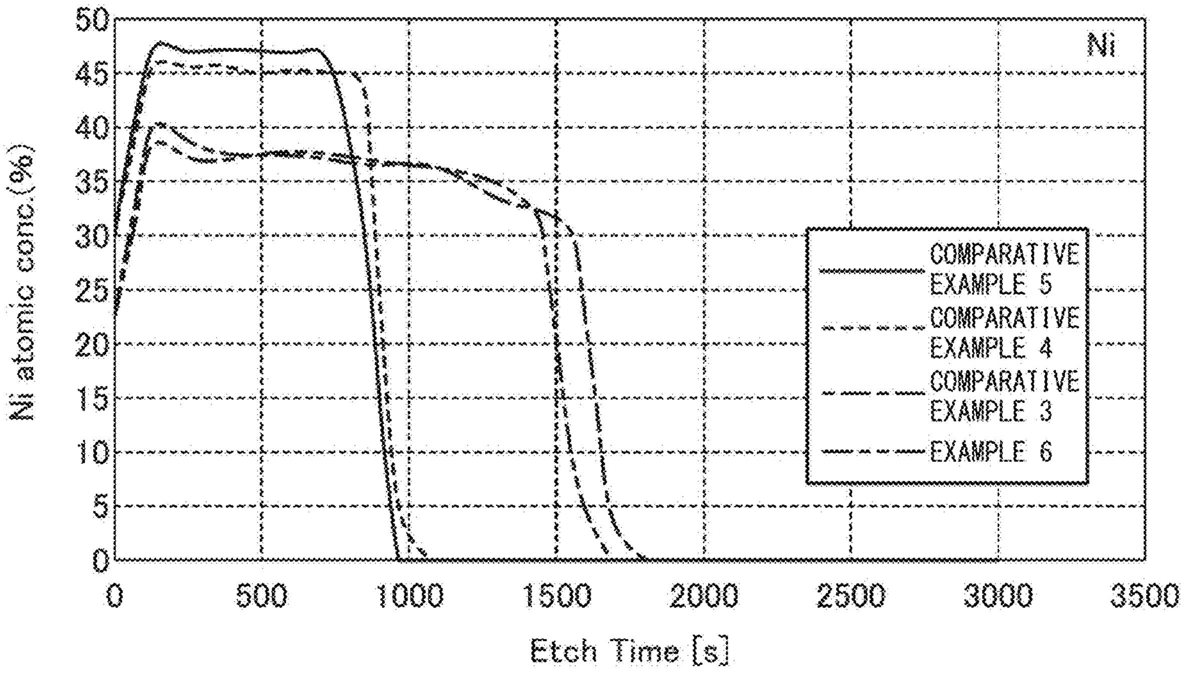
FIG. 24 shows the result of analysis in the depth direction by X-ray photoelectron spectroscopy (part 1).
Figure 25:
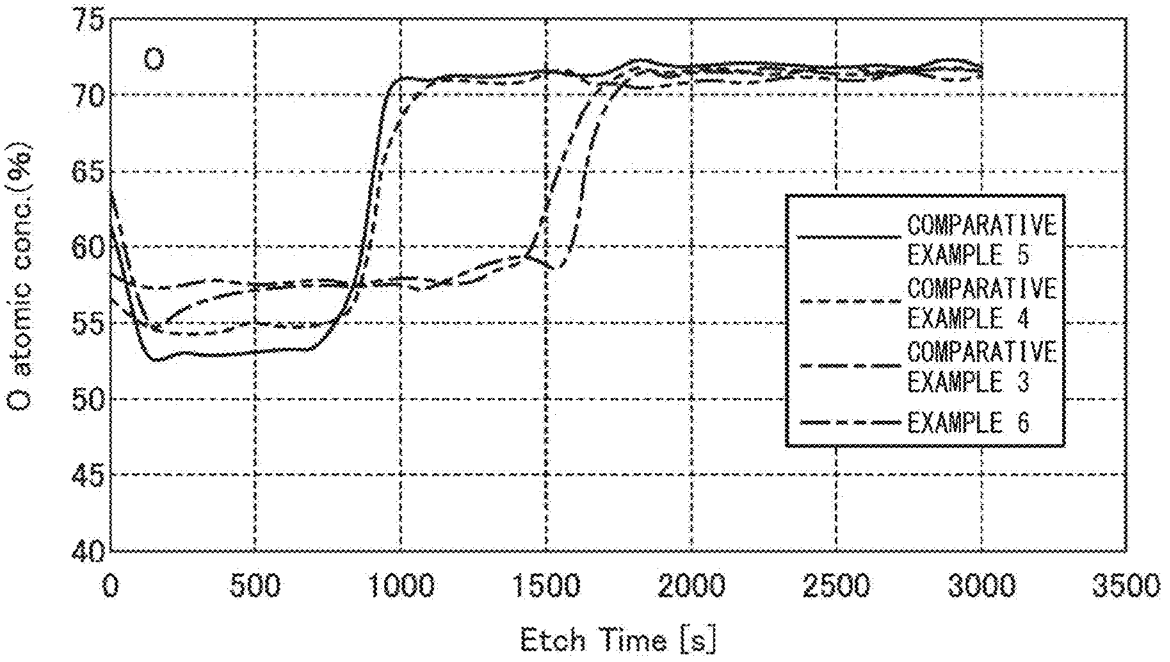
FIG. 25 shows the result of analysis in the depth direction by X-ray photoelectron spectroscopy (part 2).
Figure 26:
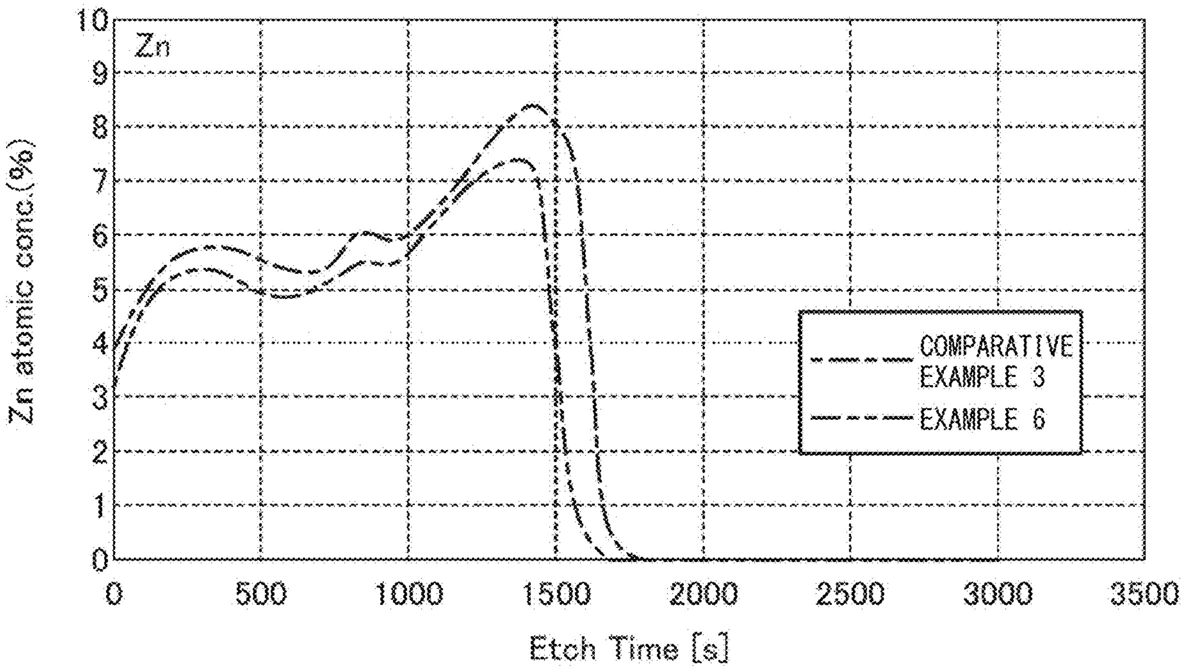
FIG. 26 shows the result of analysis in the depth direction by X-ray photoelectron spectroscopy (part 3).

FIGS. 24 to 26 show the results of analysis in the depth direction by X-ray photoelectron spectroscopy. More specifically, FIG. 24 shows the result of analysis of Ni in the depth direction, FIG. 25 shows the result of analysis of O in the depth direction, and FIG. 26 shows the result of analysis of Zn in the depth direction. The thicknesses of the hole transport layer in example 6 and comparative examples 3 to 5 are equal, but the sputtering time of the hole transport layer is longer in example 6 and comparative example 3, in which Zn was added, than in comparative examples 4 and 5, in which Zn was not added. This is probably because Zn-doping increased the film density of the hole transport layer. Tables 2 and 3 show the results of composition analysis and measurement of electrical conductivity and transmittance.

In example 6, in which the percentage of O at approximately 20 nm from the surface on the light-absorbing layer side of the hole transport layer (corresponding to approximately ⅓ of the film thickness of the hole transport layer) is 57.6 at % and is higher than in comparative examples 3 to 5, a hole transport layer excelling in both translucency and electrical conductivity can be provided. Below is the result of consideration as to why a hole transport layer excelling in both translucency and electrical conductivity is provided.

First, in example 6, Zn-doping results in Zn substituting for Ni, which increases Ni holes to increase both electrical conductivity and the density of NiO. Subsequently, UV ozone treatment supplies O to the inside of NiO excessively, which causes O to appear between lattices and increases Ni holes to increase electrical conductivity, and simultaneously causes a deep energy level to appear to cause coloring. However, in example 6, since the density of NiO is high, O does not invade the film deep in UV ozone treatment, which reduces coloring and prevents reduction in transmittance. On the other hand, since O invades the vicinity of the film

TABLE 2

| Sample names | Zn-doping | UV ozone treatment | Transmittance (%) | Electrical conductivity (%) | Results of composition analysis (at %) (the whole hole transport layer) | | |
|---|---|---|---|---|---|---|---|
| | | | | | O | Ni | Zn |
| Example 6 | Yes | Yes | 71.7 | $1.3 \times 10^{-3}$ | 57.9 | 36.2 | 5.7 |
| Comparative example 3 | Yes | No | 81.4 | $4.0 \times 10^{-5}$ | 57.3 | 36.4 | 6.2 |
| Comparative example 4 | No | Yes | 59.5 | $1.4 \times 10^{-3}$ | 54.8 | 45.2 | — |
| Comparative example 5 | No | No | 83.8 | $1.1 \times 10^{-7}$ | 53.2 | 46.8 | — |

In example 6 in Table 2, in which both Zn-doping and UV ozone treatment are performed, a hole transport layer excelling in translucency and electrical conductivity is made. As for comparative example 3, in which Zn-doping is performed but LV ozone treatment is not performed, translucency is excellent but electrical conductivity is low. As for comparative example 5, in which UV ozone treatment is performed but Zn-doping is not performed, electrical conductivity is excellent, but translucency is poor. As for comparative example 4, in which neither Zn-doping nor UV ozone treatment is performed, translucency is excellent but electrical conductivity is low.

Table 3 below shows the results of composition analysis of the O percentage at approximately 20 nm from the surface of each sample (corresponding to approximately ⅓ of the film thickness of the hole transport layer).

TABLE 3

| Sample names | Zn-doping | UV ozone treatment | Results of composition analysis (at %) (Near the surface of the hole transport layer) O |
|---|---|---|---|
| Example 6 | Yes | Yes | 57.6 |
| Comparative example 3 | Yes | No | 56.1 |
| Comparative example 4 | No | Yes | 54.7 |
| Comparative example 5 | No | No | 53.0 |

surface (down to approximately 20 nm from the surface on the light-absorbing layer side of the hole transport film or ⅓ of the film thickness of the hole transport layer), O is supplied to O holes serving as a donor compensating an acceptor near the surface, improving electrical conductivity.

In other words, Zn-doping and UV ozone treatment increase the O percentage near the surface on the light-absorbing layer side of the hole transport layer, and thereby can prevent reduction in transmittance and increase electrical conductivity of the hole transport layer.

In example 6, a light-absorbing layer, an electron transport layer, and a second conductive layer are not formed. However, the hole transport layer will probably excel in translucency and electrical conductivity even when a light-absorbing layer, an electron transport layer, and a second conductive layer are further formed to produce a photoelectric conversion element.

Figure 27:
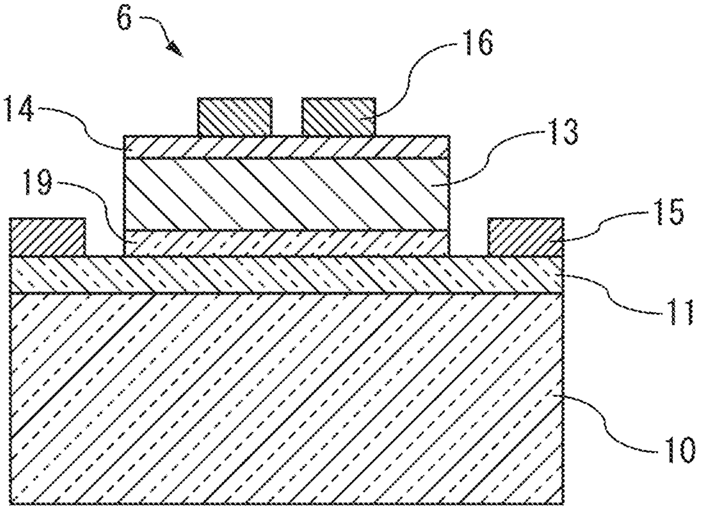
FIG. 27 is a cross-sectional view of a photoelectric conversion element according to a fourth embodiment.

FIG. 27 is a cross-sectional view of a photoelectric conversion element according to a fourth embodiment. The following describes a photoelectric conversion element 6, using FIG. 27.

The photoelectric conversion element 6 differs from the photoelectric conversion element 1 in that the former includes a hole transport layer 19, instead of the hole transport layer 12. Since the configurations and functions of components of the photoelectric conversion element 6 except the hole transport layer 19 are the same as those of the photoelectric conversion element 1 assigned the same reference numerals, detailed description thereof is omitted herein.

The hole transport layer 19 has the same configuration as the hole transport layer 23 included in the laminated film 4. The hole transport layer 19 includes Zn-doped nickel oxide, and is formed on the first conductive layer 22. In the hole transport layer 19, the percentage of Ni is from 30 at % to 40 at % inclusive, the percentage of O is from 55 at % to 60 at % inclusive, and the percentage of Zn is from 3 at % to 15 at % inclusive. The percentage of Ni is preferably from 32 at % to 38 at % inclusive, the percentage of O is preferably from 57 at % to 59 at % inclusive, and the percentage of Zn is preferably from 4 at % to 10 at % inclusive.

In the hole transport layer 19, X-ray photoelectron spectroscopy analysis made in the depth direction, also referred to as Z-direction, from a surface S of the hole transport layer 19 remote from the first conductive layer 11 shows that the percentage of O is 56.5 at % or greater from the surface S to a depth of 20 nm. In the hole transport layer 19 the percentage of O is preferably 57.0 at % or greater from the surface S to a depth of 20 nm.

In the photoelectric conversion element 6, the electron transport layer may contain fullerene or phenyl-$C_{61}$-butyric acid methyl ester. The photoelectric conversion element 6 may include an interdiffusion inhibiting layer that is disposed between the hole transport layer and the light-absorbing layer and that inhibits interdiffusion of chemical elements contained in the hole transport layer and the light-absorbing layer. The interdiffusion inhibiting layer may be a $SiO_2$ layer. In the photoelectric conversion element 6, the composition ratio preferably satisfies 2≤b/a≤2.5, and the substrate preferably has flexibility.

The photoelectric conversion element 6 is manufactured by the manufacturing method of the photoelectric conversion element 1 described with reference to FIG. 6, except for the hole transport layer forming step. The hole transport layer forming step of the photoelectric conversion element 6 is the same as the method for forming the hole transport layer of the laminated film.

The photoelectric conversion element 6, which includes the hole transport layer 19 having the same configuration as the hole transport layer 23 instead of the hole transport layer 12, further improves in translucency and electrical conductivity as compared to the photoelectric conversion element 1.

Figure 28:
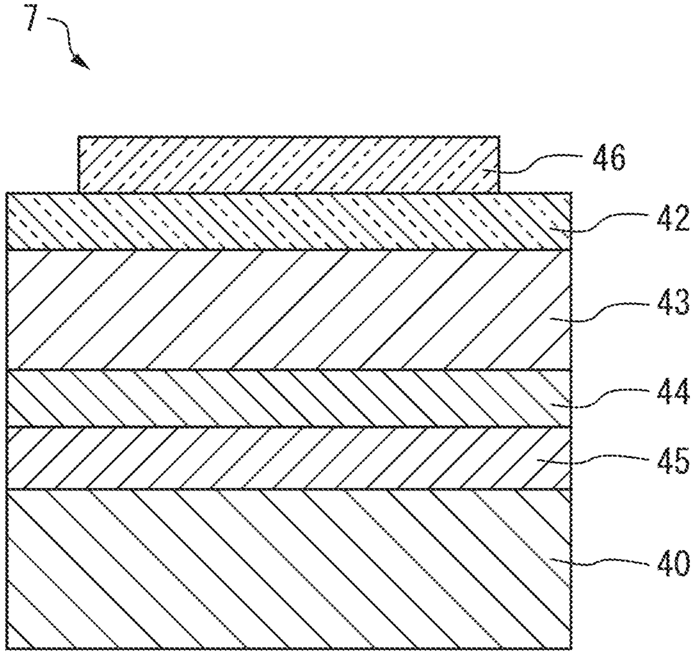
FIG. 28 is a cross-sectional view of a photoelectric conversion element according to a fifth embodiment.

FIG. 28 is a cross-sectional view of a photoelectric conversion element according to a fifth embodiment. The following describes a photoelectric conversion element 7, using FIG. 28.

The photoelectric conversion element 7 includes a substrate 40, a second conductive layer 45, an electron transport layer 44, a light-absorbing layer 43, a hole transport layer 42, and a first conductive layer 46 formed in this order, and is an inverted photoelectric conversion element on which light is incident on the light-absorbing layer 43 through the first conductive layer 46 and the hole transport layer 42.

The substrate 40 may be an opaque material, such as silicon. The second conductive layer 45 is formed of an electrically conductive material whose film can be formed on the substrate 40, such as gold, and is formed on the substrate 40, thereby being disposed with a surface in contact with a surface of the substrate 10. The electron transport layer 44 has the same configuration and function as the electron transport layer 14, and is formed on the second conductive layer 45, thereby being disposed with a surface in contact with the surface of the second conductive layer 45.

The light-absorbing layer 43 has the same configuration and function as the light-absorbing layer 13, and is formed on the electron transport layer 44, thereby being disposed with a surface in contact with the other surface of the electron transport layer 44. The light-absorbing layer 43 is formed of a rudorffite expressed by the composition formula $Ag_aBi_bI_c$. In the composition formula $Ag_aBi_bI_c$, a, b, and c indicate the composition ratio, and satisfy c=a+3b, preferably 2≤b/a≤4, and more preferably 2≤b/a≤2.5.

The hole transport layer 42 has the same configuration and function as the hole transport layer 12, and is formed on the light-absorbing layer 43, thereby being disposed with a surface in contact with the other surface of the light-absorbing layer 43. The first conductive layer 46 has the same configuration and function as the lower conductive layer 11, and is formed on the hole transport layer 42, thereby being disposed with a surface in contact with the other surface of the hole transport layer 42.

The invention claimed is:

1. A photoelectric conversion element comprising, in sequence:

a first conductive layer having light transparency;

a hole transport layer;

a light-absorbing layer;

an electron transport layer; and a second conductive layer, wherein light incident through the first conductive layer is photoelectrically converted, the hole transport layer includes Zn-doped nickel oxide, in the hole transport layer, the percentage of Ni is from 30 at % to 40 at % inclusive, the percentage of O is from 55 at % to 60 at % inclusive, and the percentage of Zn is from 3 at % to 15 at % inclusive, and the photoelectric conversion element further comprises an interdiffusion inhibiting layer that is disposed between the hole transport layer and the light-absorbing layer and that inhibits interdiffusion of chemical elements contained in the hole transport layer and the light-absorbing layer.

2. The photoelectric conversion element according to claim 1, wherein the interdiffusion inhibiting layer is a $SiO_2$ layer.

3. The photoelectric conversion element according to claim 1, further comprising a substrate having flexibility.

4. The photoelectric conversion element according to claim 1, wherein the light-absorbing layer expressed by a composition formula $Ag_aBi_bI_c$, and in the composition formula, the composition ratio a, b, and c satisfies c=a+3b and 2≤b/a≤2.5.

* * * * *